(12) United States Patent
Malmqvist

(10) Patent No.: US 8,457,192 B2
(45) Date of Patent: Jun. 4, 2013

(54) PULSE WIDTH MODULATOR

(75) Inventor: Håkan Malmqvist, Hägersten (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 1021 days.

(21) Appl. No.: 12/519,841

(22) PCT Filed: Dec. 18, 2006

(86) PCT No.: PCT/SE2006/050592
§ 371 (c)(1),
(2), (4) Date: Jun. 18, 2009

(87) PCT Pub. No.: WO2008/076021
PCT Pub. Date: Jun. 26, 2008

(65) Prior Publication Data
US 2010/0014575 A1 Jan. 21, 2010

(51) Int. Cl.
*H03K 7/08* (2006.01)

(52) U.S. Cl.
USPC ........... 375/238; 375/239; 375/295; 375/297; 332/109; 332/112; 330/9; 330/10; 330/251

(58) Field of Classification Search
USPC ................ 375/238, 239, 295, 297; 330/9, 10, 330/251; 332/109, 112
See application file for complete search history.

(56) References Cited

U.S. PATENT DOCUMENTS 6,587,010 B2 * 7/2003 Wagh et al. .................... 332/105
7,932,790 B2 * 4/2011 Rexberg et al. ............... 332/109

OTHER PUBLICATIONS

Rosnell J. Varis, "Bandpass Pulse-Width modulation (BP-PWN)",2005,IEEE pp. 731-734.*

* cited by examiner

*Primary Examiner* — Daniel Washburn
*Assistant Examiner* — Rahel Guarino
(74) *Attorney, Agent, or Firm* — Roger S. Burleigh

(57) ABSTRACT

A switch-modulator for a radio-frequency power amplifier, arranged to modulate the I-signal and the Q-signal of the complex components (I+j·Q) separately in an I-signal part and a Q-signal part in order to create a modulated I-signal pulse sequence and a modulated Q-signal pulse sequence, wherein the modulation comprises a time-shift of the pulse positions within a sample interval.

15 Claims, 20 Drawing Sheets

PULSE WIDTH MODULATOR

TECHNICAL FIELD

The present invention relates to a switch-modulator for a switched-mode radio-frequency power amplifier and to an integrated circuit comprising said switch-modulator, as well as to a method of switch-modulating a radio frequency power amplifier.

BACKGROUND

Modern radio communications system (e.g. WCDMA, Wideband Code Division Multiple Access) utilize digital modulation schemes in which both the amplitude and the phase of a complex base band signal are modulated onto the envelope of a Radio Frequency (RF) carrier, thus constituting a band pass RF signal. One way of a achieving such a band pass RF signal is to use Pulse Width Modulation (PWM) and Pulse Position Modulation (PPM) of a switched-mode power amplifier operating at the carrier frequency.

In a switched-mode power amplifier, the power transistors are either in a fully conducting ON-state or in a completely non-conducting OFF-state, and a switched-mode power amplifier may achieve a much higher power efficiency (ideally up to 100%) than a linear power amplifier.

In conventional PWM (Pulse Width Modulation), the amplitude of a signal is mapped onto the width of a pulse at each sample, and a single pulse is transmitted by the modulator for each incoming sample. Further, in conventional PPM (Pulse Position Modulation), the phase information of the signal is mapped onto the position of the pulse, and PPM (Pulse Position Modulation) may be used together with PWM (Pulse Width Modulation) in a PWM/PPM in order to create a pulse sequence representing both the amplitude and the phase of the signal. FIG. 2 illustrates how the amplitude of a signal 1 sampled at Ts0 is mapped onto the width, i.e. duration, of a modulated pulse 3, and the phase of the signal sample is mapped onto the position of the pulse 3 within the time interval between two samples Ts=Ts1−Ts0, i.e. the sampling interval or sampling period.

Although the use of switched-mode RF amplifiers is still limited due to the high switching frequencies needed, the generation of the necessary band pass RF signal using PWM/PPM only requires switching at the carrier frequency and not a multiple of this frequency, as in the case of e.g. band pass Delta-Sigma modulation or low pass PWM. Thereby, the necessary digital and analogue circuitry for a PWM/PPM may be implemented as an integrated circuit, e.g. in the form of an RF ASIC (Radio Frequency Application Specific Integrated Circuit).

FIG. 1 is a block diagram illustrating a conventional conceptual switched-mode architecture, consisting of any suitable switch-modulator 2 arranged to modulate a base band input signal to present a pulse-sequence 3 forming a binary-level signal with correct switching positions to a power amplifier 4. Thereafter, the amplified pulse sequence 5 is filtered by a properly designed filter 6 tuned around the carrier frequency in order to filter out a correct amplified radio frequency output signal 7.

The technique explained in FIG. 2 is applied in the conventional arrangement illustrated in FIG. 3, in which the Cartesian coordinates of a base band signal I+jQ, i.e. the I-signal and the Q-signal, are converted into Polar coordinates by the converter 10. The amplitude-signal, A, and the phase-signal, φ, representing the Polar coordinates are modulated by a conventional, combined PWM/PPM 8, by which the amplitude-signal is mapped on the width of a pulse and the phase-signal is mapped on the position of said pulse within the sampling period of the baseband signal. Since the mapping of the input amplitude onto a pulse width is a non-linear function, i.e. a sine-function, an inverse (i.e. arcsine) pre-distorter is needed to obtain a linear output, and this correction is pre-calculated in the correcting calculator 11 in the illustrated arrangement. FIG. 4 further indicates the pulse sequence 3 created by the combined PWM/PPM 8 representing both the amplitude and phase of the base band signal, as described above. Thereafter, the pulse sequence 3 is amplified by the power amplifier 4, and the amplified pulse sequence 5 is filtered by the band pass filter 6, resulting in an amplified base band signal 7 on the output.

Related art within the technical field is disclosed e.g. in US2004/0246060, which describes a modulator for generating a two-level signal suitable for amplification by a switching mode power amplifier, such as a Class D amplifier.

However, the above-described conventional arrangements and related art involve several drawbacks. For example, a combined pulse width—and pulse position-modulation with a fixed sample period, Ts, may lead to "wrap-around", or phase jump, of a pulse when the phase mapping extends over the +/−180 degree border. This "wrap-around" is illustrated in FIG. 4, in which the pulse representing the sample at Ts0 is "wrapped" within the sample period, since this first pulse cannot extend over to the next sample interval. Instead, a second pulse will be transmitted during the next interval, and this second pulse will represent the amplitude and phase of the second sample, at Ts1. This phase jump may also lead to missing or wrong pulse widths at the phase jump position.

It is further known within this technical field to combine the above-described PWM (pulse-width modulation) and PPM (pulse-position modulation) with band pass Delta-Sigma (DS) modulation. However, band pass DSM involves some drawbacks, such as a high out-of-band noise and a very high switching frequency. Normally, the sampling frequency fs=4·carrier frequency, such as in an fs/4 band pass DS-modulator.

A drawback with the combined PW/PP-modulation is the time granularity of a digitally defined pulse width and position, which restricts the achievable dynamic range due to quantization noise. At least 512 levels would be required for the width or positioning in order to reach 60-70 dB dynamic range, and this requires a clock frequency and a speed of the digital circuitry that is not achievable today.

Thus, it still presents a problem to achieve a switch-modulator architecture for a switched-mode radio-frequency power amplifier enabling linear amplification of radio-frequency signals over a large bandwidth with a high dynamic range and without "wrap-around" problems, suitable for implementation as an integrated circuit.

SUMMARY

An object of the present invention is to address the problem outlined above, and to provide an improved switch-modulator architecture for a switched-mode radio frequency power amplifier. This object and others are achieved by the switch-modulator, the integrated circuit and the method of switch-modulating, according to the appended claims.

According to a first aspect, the invention relates to a switch-modulator for a switched-mode radio-frequency power amplifier, said switch-modulator arranged to map the phase and amplitude of an input complex baseband signal represented by the components I and Q onto a modulated output pulse sequence. The switch-modulator is arranged to sample and modulate the I-signal and the Q-signal separately, the modulation comprising a time-shift of the pulse positions within a sampling interval. The switch-modulator comprises a first input to a separate I-signal path in the switch-modulator, a second input to a separate Q-signal path in the switch-modulator, and a third input to a quadrature clock generator in the switch-modulator. The quadrature clock generator is arranged to generate an I-clock signal and a Q-clock signal with a quadrature-shifted phase-relationship in order to delay a modulated I-signal pulse sequence relative a modulated Q-signal pulse sequence and to generate the time-shift of the pulse positions in said pulse sequences.

Said generated I-clock signal and Q-clock signal may be sinusoidal, generating an arcsine pre-distortion.

This switch modulator-configuration facilitates implementation as an integrated circuit, e.g. on an RF-ASIC (Radio Frequency-Application Specific Integrated Circuit), applicable in various different switched-mode radio frequency power amplifier arrangements. By using separate I-signal- and Q-signal paths through the switch-modulator and encoding the total amplitude and phase information of a radio-frequency signal in a properly time-shifted pulse sequence, wrap-around and phase-jumps are avoided, and the radio architecture of the switched-mode radio frequency power amplifier is simplified, achieving a large power efficiency and dynamic range.

The modulation of the I-signal and the Q-signal may comprise mapping of the sample amplitude of the I-signal and the Q-signal on the differential time position of two balanced 50%-duty cycle I-signal pulse sequences and two balanced 50%-duty cycle Q-signal pulse sequences respectively.

Alternatively, the modulation comprises mapping of the sample amplitude on the pulse width, and time-shifting the pulses corresponding to negative sample values relative the pulses corresponding to positive sample values onto a modulated unbalanced I-signal pulse sequence and a modulated unbalanced Q-signal pulse sequence, respectively, and the I-clock signal and said Q-clock signal may be arranged to generate correct time-shifted positions and pulse width for the pulses in said pulse sequences. The switch-modulator may further comprise a combiner arranged to generate a combined modulated pulse sequence, representing the complex I+j·Q-signal, from the modulated unbalanced I-signal pulse sequence and the modulated unbalanced Q-signal pulse sequence.

The time-shift of the negative sample pulses relative the positive sample pulses may correspond to 0.5 of a sampling interval Ts, and the delay of the I-signal output pulse sequence relative the Q-signal output pulse sequence may be 0.25 of a sampling interval Ts, which corresponds to a 90-degree phase-shift and simplifies the combination into a complex I+j·Q-signal.

The switch-modulator may further comprise two I-signal comparators for generating two differentially time-shifted balanced I-signal output pulse sequences from the I-clock signal and from two opposite phase and chopped I-signals, and two Q-signal comparators for generating two differentially time-shifted balanced Q-signal output pulse sequences from the Q-clock signal and from two opposite phase chopped Q-signals. It may also comprise two I-signal outputs for the differentially time-shifted balanced modulated I-signal pulse sequences and two Q-signal outputs for the differentially time-shifted balanced modulated Q-signal pulse sequences. Additionally, the switch-modulator may comprise an I-signal-gate for generating an unbalanced I-signal output pulse sequence from said two differentially time-shifted balanced I-signal output pulse sequences, and an Q-signal-gate for generating an unbalanced Q-signal output pulse sequence from said two differentially time-shifted balanced Q-signal output pulse sequences, as well as an I-signal output for the unbalanced modulated I-signal pulse sequence and an Q-signal output for an unbalanced modulated Q-signal pulse sequence.

The switch-modulator may further comprise a Cartesian-to-polar-converter for converting the I-signal and the Q-signal representing an input baseband signal into an A(t)-signal representing the amplitude of said input baseband signal and connected to said first I-signal input, and into a phase modulated ω(t)-signal representing the phase of the input baseband signal and connected to said third clock input.

Alternatively, the switch-modulator may be provided with a combiner for adding the unbalanced I-signal output pulse sequence to the unbalanced Q-signal output pulse sequence, resulting in a combined modulated pulse sequence representing a modulated input baseband signal I+j·Q, of which said combiner may comprise an OR-gate, and the switch modulator may further comprise a signal-output for the modulated complex I+jQ-pulse sequence.

According to a second aspect, the invention relates to an integrated circuit provided with a switch-modulator according to the above-described first aspect.

According to a third aspect, the invention relates to a method of switch-modulating a radio-frequency power amplifier, in which method the input signal is represented by the I-signal and Q-signal of the complex components (I+j·Q). The method comprises the steps of:

Sampling and pulse width modulating the I-signal and the Q-signal separately to create a modulated I-signal pulse sequence and a modulated Q-signal pulse sequence;

Time shifting the pulses corresponding to negative sample values relative the pulses corresponding to positive sample values;

Delaying each pulse of the I-signal pulse sequence by introducing a delaying time shift;

Combining the I-signal pulse sequence and the Q-signal pulse sequence before amplification of the combined pulse sequence.

The method may comprise the additional step of restricting the peak-values of the input I-signal and Q-signal to avoid overlapping pulses.

The pulse width modulation may comprise mapping of the sample amplitude on the width of a pulse of a modulated pulse sequence, and the delaying time shift in the I-branch may be 0.25 Ts, which corresponds to a 90-degree phase shift, and the time shift of the negative sample pulses relative the positive sample pulses may be 0.5 Ts.

BRIEF DESCRIPTION OF THE DRAWINGS

The present invention will now be described in more detail and with reference to the accompanying drawings, in which.

DETAILED DESCRIPTION

Figure 1:
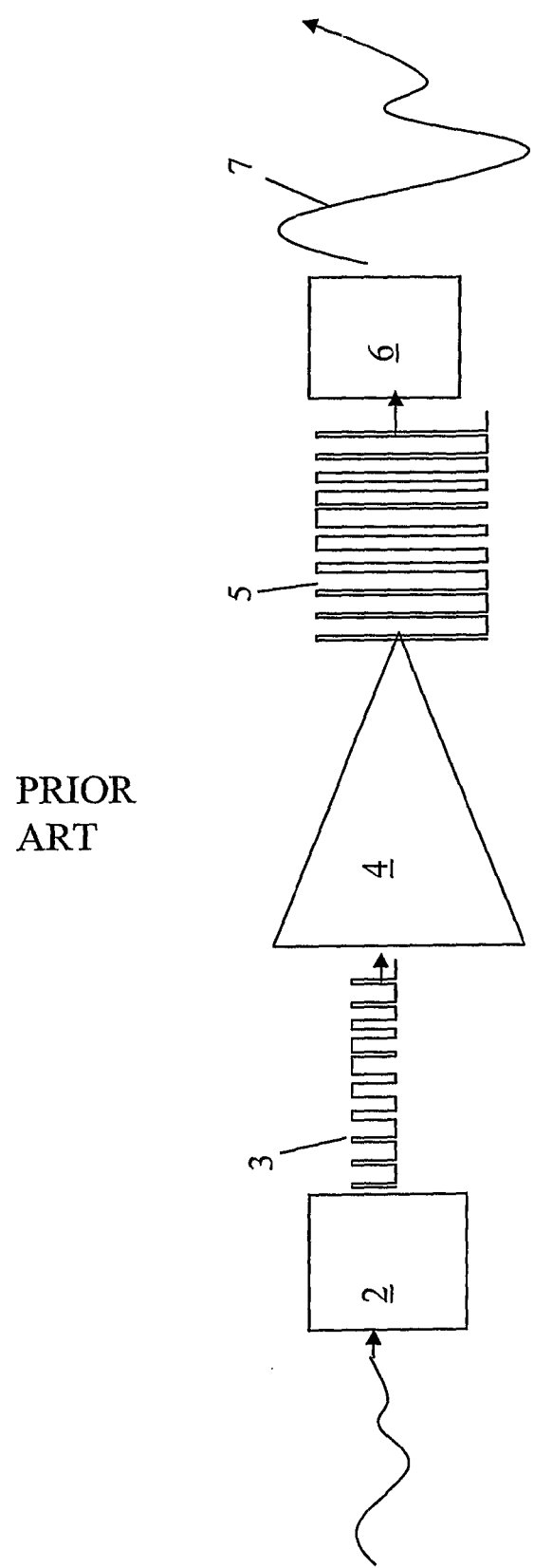
FIG. 1 is a block diagram schematically illustrating a conventional switch-modulated amplifier arrangement.
Figure 2:
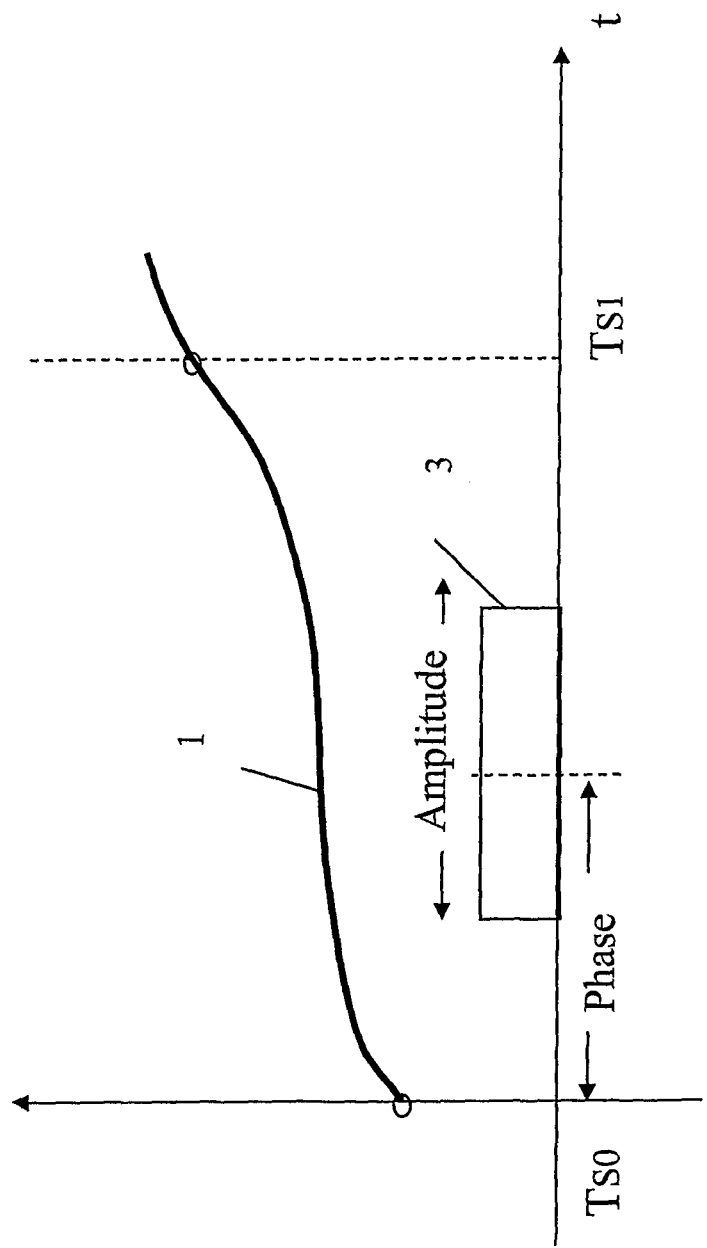
FIG. 2 illustrates mapping of the amplitude and phase of a signal onto a pulse.
Figure 3:
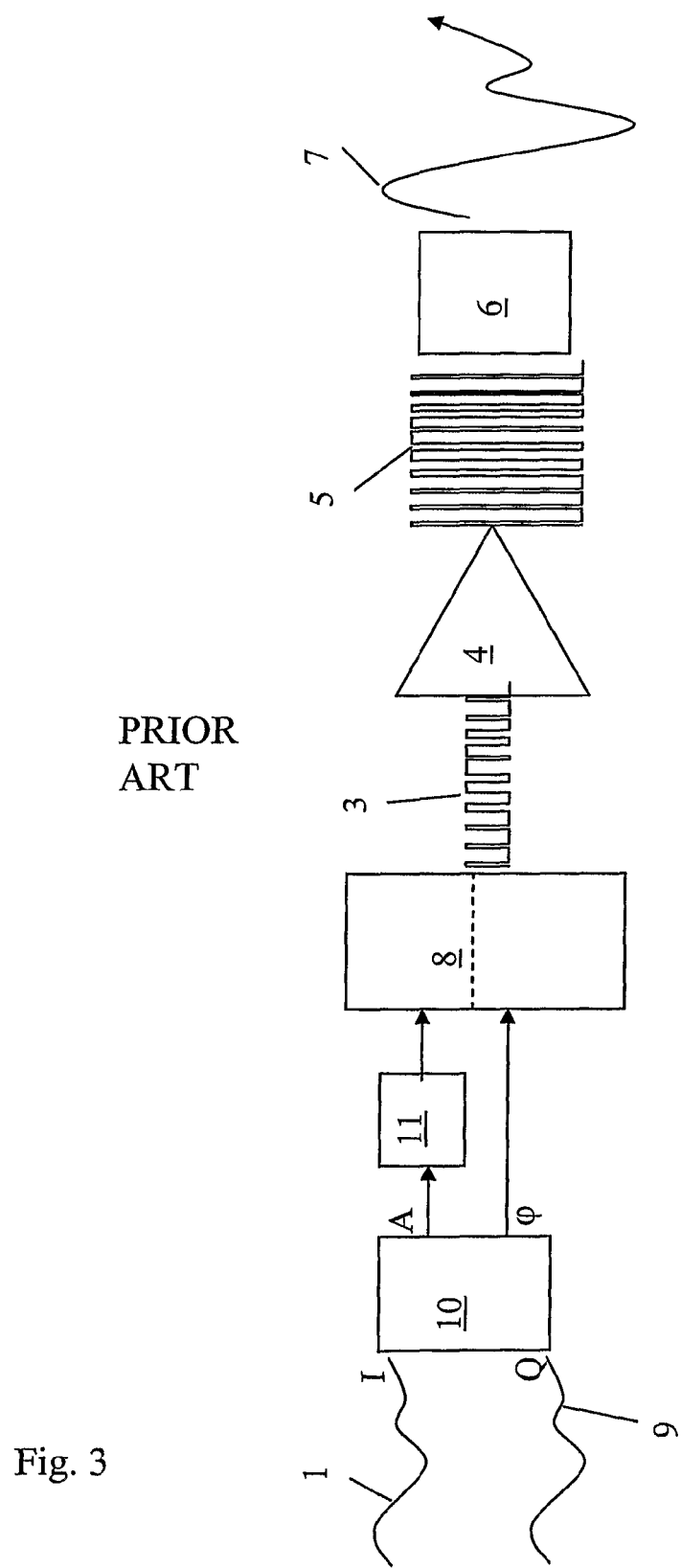
FIG. 3 is a block diagram illustrating a conventional arrangement of a combined pulse-width modulator and pulse position modulator.
Figure 4:
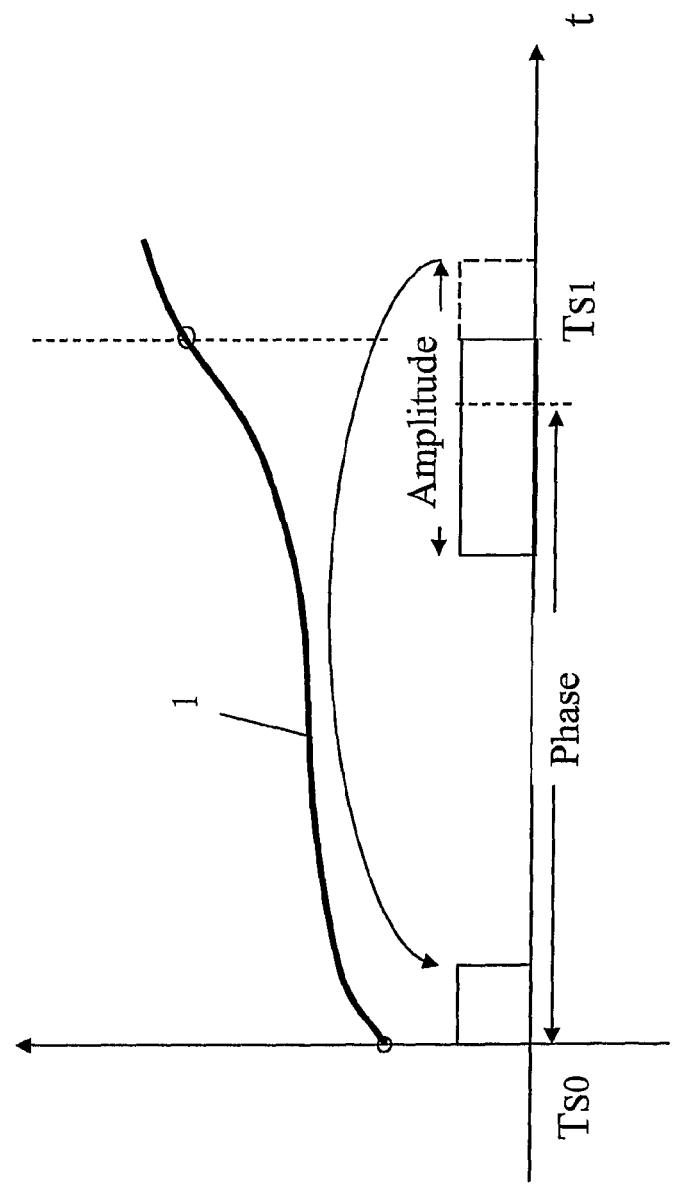
FIG. 4 illustrates "wrap around" that may occur when the phase of a signal is mapped onto the position of a pulse within a fixed sampling period.

In the following description, specific details are set forth, such as a particular architecture and sequences of steps in order to provide a thorough understanding of the present invention. However, it is apparent to a person skilled in the art that the present invention may be practised in other embodiments that may depart from these specific details.

Moreover, it is apparent that the described functions may be implemented using software functioning in conjunction with a programmed microprocessor or a general purpose computer, and/or using an application-specific integrated circuit. Where the invention is described in the form of a method, the invention may also be embodied in a computer program product, as well as in a system comprising a computer processor and a memory, wherein the memory is encoded with one or more programs that may perform the described functions.

This invention relates to a switch-modulator for a switched-mode radio-frequency power amplifier, and the switch-modulator is capable of mapping information regarding both the amplitude and the phase of the base band signal onto a modulated output pulse sequence. Instead of mapping the phase on the position of the pulse between two samples, as a conventional PWM/PPM (pulse width modulator/pulse position modulator), a switch-modulator according to this invention comprises separate inputs and paths for the I-signal and the Q-signal, respectively, of an input baseband signal. The I-signal and the Q-signal represents the Cartesian coordinates of a complex number, expressed as $I+j\cdot Q$, of which the real component I represents the In-phase component, i.e. the I-signal, and the imaginary component Q represents the Quadrature-phase component, i.e. the Q-signal, of the signal. The switch-modulator according to this invention comprises an I-signal part and a Q-signal part arranged to sample and modulate the I-signal and the Q-signal separately, and the modulation comprises a time-shift of the pulse positions within a sampling interval. Further, in order to forward the complex number $I+j\cdot Q$ representing the base band signal, and not the real part (I) and the imaginary part (Q) separately, the two signals will be transformed into one signal corresponding to $I+j\cdot Q$, either before or after the amplification of the separate signals. Since a multiplication by "j" corresponds to a phase-shift of 90° and a time-shift of 0.25·time period, the switch-modulator according to his invention performs a delay, i.e. a time-shift, of the I-branch by 0.25 Ts, of which the sampling period Ts is the sampling period at radio frequency (RF). Thereafter, the signals are combined in order to achieve $I+j\cdot Q$, and finally the signal will be filtered in order to create a correct, amplified radio-frequency signal.

The above-described switch-modulator according to this invention enables a circuit design that is suitable for implementing as an integrated circuit. By using separate I- and Q-paths through the modulator and maintaining a proper time-shift of the binary signals in order to encode the total phase information in an amplified radio-frequency signal, the wrap-around and phase-jump problem is solved and the total radio architecture is simplified, thereby facilitating implementation on an RF-ASIC (Radio Frequency-Application Specific Integrated Circuit).

Figure 5:
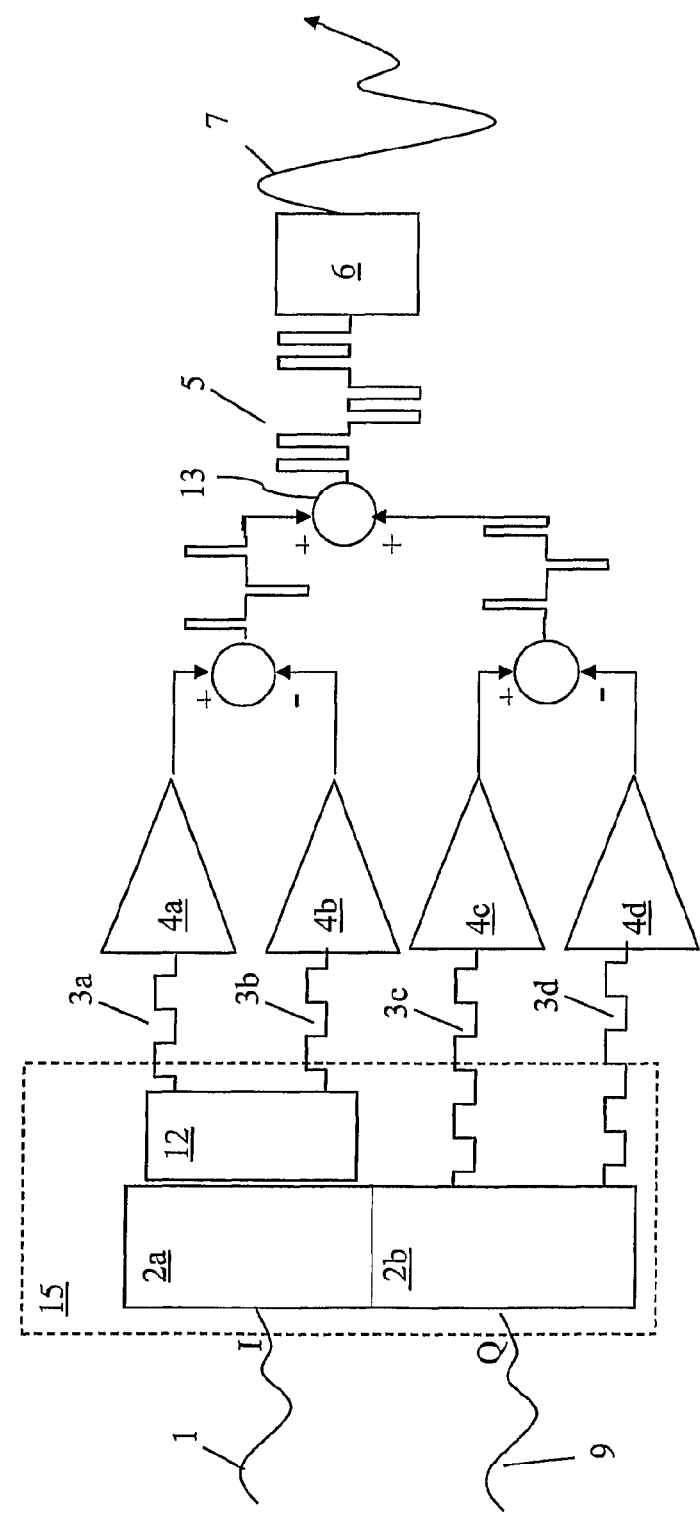
FIG. 5 is a block diagram illustrating a first example of a switch-modulated amplifier arrangement.

FIG. 5 shows a first exemplary switched-mode amplifier arrangement, comprising a switch modulator 15 according to a first embodiment of this invention, capable of modulating the I-signal branch 1 and of the Q-signal branch 9 of a base band signal separately by mapping the amplitude of each sample on differentially time-shifted positions of two 50% duty cycle pulses. The modulator comprises an I-signal part 2a, a Q-signal part 2b, and a delay unit 12, arranged to delay the I-signal with 0.25 Ts.

The resulting balanced, i.e. in a time-shift balanced sense, pulse sequences 3a, 3b, 3c, 3d from the switch modulator 15 are amplified by four functionally separate power amplifiers 4a, 4b, 4c, 4d, and the amplified signals are first pair-wise differentially combined by suitable combiners, thereby creating pulse-width modulated bipolar I- and Q pulse sequences. The bipolar I and Q pulse sequences are combined by a suitable combiner 13, creating a combined amplified pulse sequence 5, which is filtered by a suitable band-pass filter 6, creating a correct amplified band pass signal 7.

Figure 6:
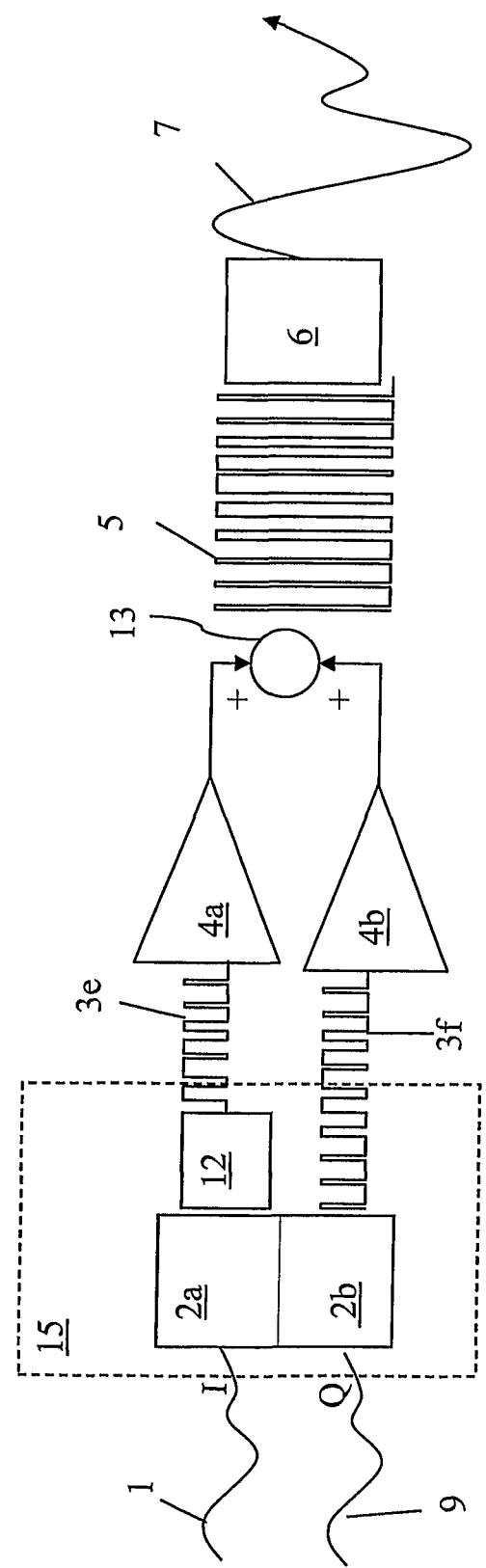
FIG. 6 is a block diagram illustrating a second example of a switch-modulated amplifier arrangement

FIG. 6 shows a second exemplary switched-mode amplifier arrangement, comprising a switch-modulator 15 according to a second embodiment of this invention, performing pulse-width modulation of the I-signal branch 1 and of the Q-signal branch 9 of a base band signal separately by mapping the amplitude of each sample on the width of a pulse, and by time-shifting the sample position and pulses of negative sample values relative the sample position and pulses of positive sample values with 0.5 Ts. The modulator comprises an I-signal part 2a, a Q-signal part 2b, and a delay unit 12 arranged to delay the I-signal with 0.25 Ts.

The resulting two separate unbalanced, i.e. in the sense of a signal not comprising a balanced time-shift, pulse sequences 3e, 3f from the switch-modulator 15 are amplified by two functionally separate power amplifiers 4a, 4b, and the amplified signals are combined by a suitable combiner 13, thereby creating a combined amplified pulse sequence 5, which is filtered by a suitable band-pass filter 6, creating a correct amplified band-pass signal 7.

Figure 7:
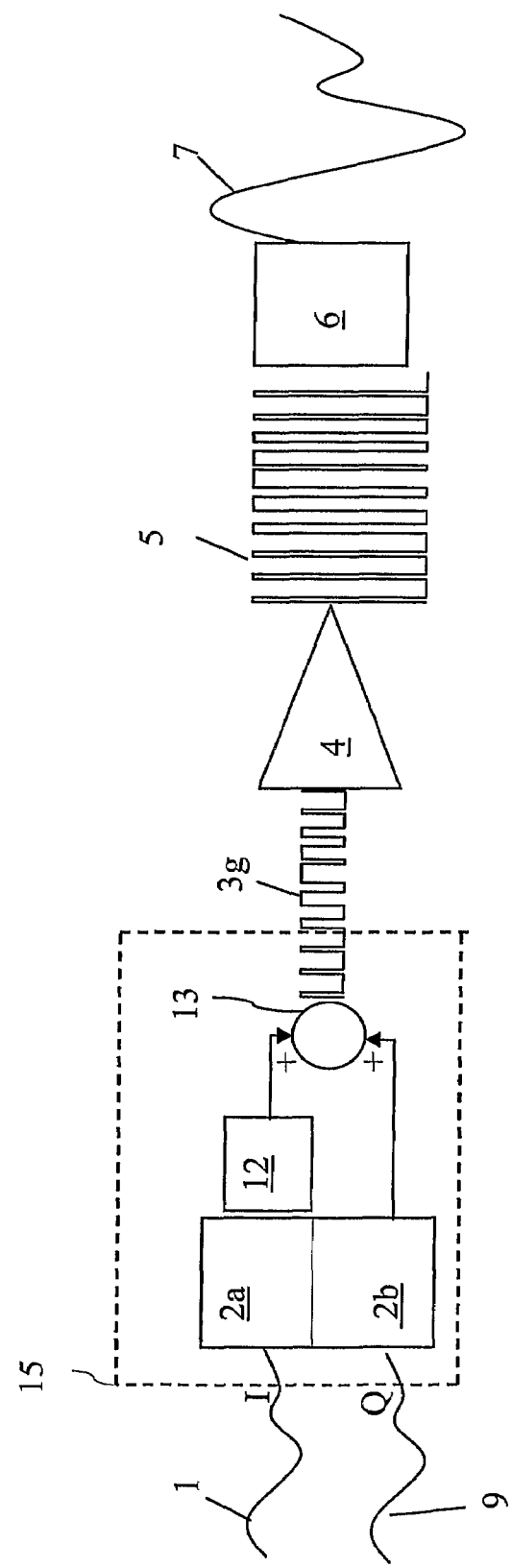
FIG. 7 is a block diagram illustrating a third example of a switch-modulated amplifier arrangement.

FIG. 7 shows a third exemplary switched-mode amplifier arrangement, comprising a switch-modulator 15 according to a third embodiment of this invention, performing pulse-width modulation of the I-signal branch 1 and of the Q-signal branch 9 of a base band signal separately by mapping the amplitude of each sample on the width of a pulse, and by time-shifting the sample position and pulses of negative sample values relative the sample position and pulses of positive sample values with 0.5 Ts. The switch-modulator comprises an I-signal part 2a, a Q-signal part 2b, a delay unit 12 arranged to delay the I-signal, and a combiner 13 arranged to combine the modulated and delayed I-signal with the modulated Q-signal within the switch-modulator, in order to deliver a combined modulated I+jQ pulse sequence 3g at the output. Thereafter, the combined pulse sequence 3g from the switch-modulator can be amplified by a single power amplifier 4, thereby creating a combined amplified pulse sequence 5, which is filtered by a suitable band-pass filter 6, creating a correct amplified band-pass signal 7.

Thus, according to the above-described first arrangement in FIG. 5, four functionally separate power amplifiers 4a, 4b, 4c, 4d are used to amplify the four separate pulse sequences 3a, 3b, 3c, 3d, of which 3a, 3b corresponds to the modulated and delayed I-signal, and 3c, 3d corresponds to the modulated Q-signal. The amplified signals are pair-wise differentially combined by suitable combiners, thereby creating pulse-width modulated bipolar I and Q pulse sequences. For this bipolar combined pulse sequence, having three levels, the positions and the polarity of the pulses encode the signs of the two input signals I and Q, according to the following exemplary Table 1:

| Signal value | Positions within T | | Polarity pattern | |
| --- | --- | --- | --- | --- |
| Positive Q | 0 T | 0.5 T | + | − |
| Negative Q | 0 T | 0.5 T | − | + |
| Positive I | 0.25 T | 0.75 T | + | − |
| Negative I | 0.25 T | 0.75 T | − | + |

Thus, in this first embodiment of the switch-modulator 15 according to the invention the amplitude and phase information is coded by the differential time positions of two 50% duty cycle pulses relative the fixed position defined for each of two separate I- and Q-signals, and subsequently by the pulse width and polarity pattern of the pulses resulting from the differential combination of two time-shifted 50% duty cycle pulses into one bipolar pulse sequence after power amplification.

According to the second arrangement in FIG. 6, two functionally separate power amplifiers 4a, 4b are used to amplify the two separate pulse sequences 3e, 3f, of which 3e corresponds to the modulated and delayed in-phase signal, I-signal, and 3f corresponds to the modulated quadrature-phase signal, Q-signal.

According to the third arrangement, illustrated in FIG. 7, only one power amplifier 4 is needed in order to amplify the combined pulse sequence 3 from the switch-modulator 15. In order to obtain a correct amplified output radio frequency signal, the combining of the In-phase (I) and the Quadrature-phase (Q) signals is preceded by a delay of the I-signal by approximately a quarter of a sample interval (i.e. by 0.25 Ts) after the pulse width modulation in the functional delay unit 12. Thereby, the pulses of the I-signal pulse sequence are time-shifted by 0.25 Ts within the sampling interval, such that the positive sample may be placed at 0.5 Ts and the negative sample pulses at 1 Ts, while the un-delayed Q-signal sample pulses may be placed at 0.25 Ts and 0.75 Ts, respectively. A delay by a quarter of a sample interval corresponds to a 90-degree phase shift, which simplifies the combination of the two orthogonal components into the complex representation I+j·Q.

Figure 8:
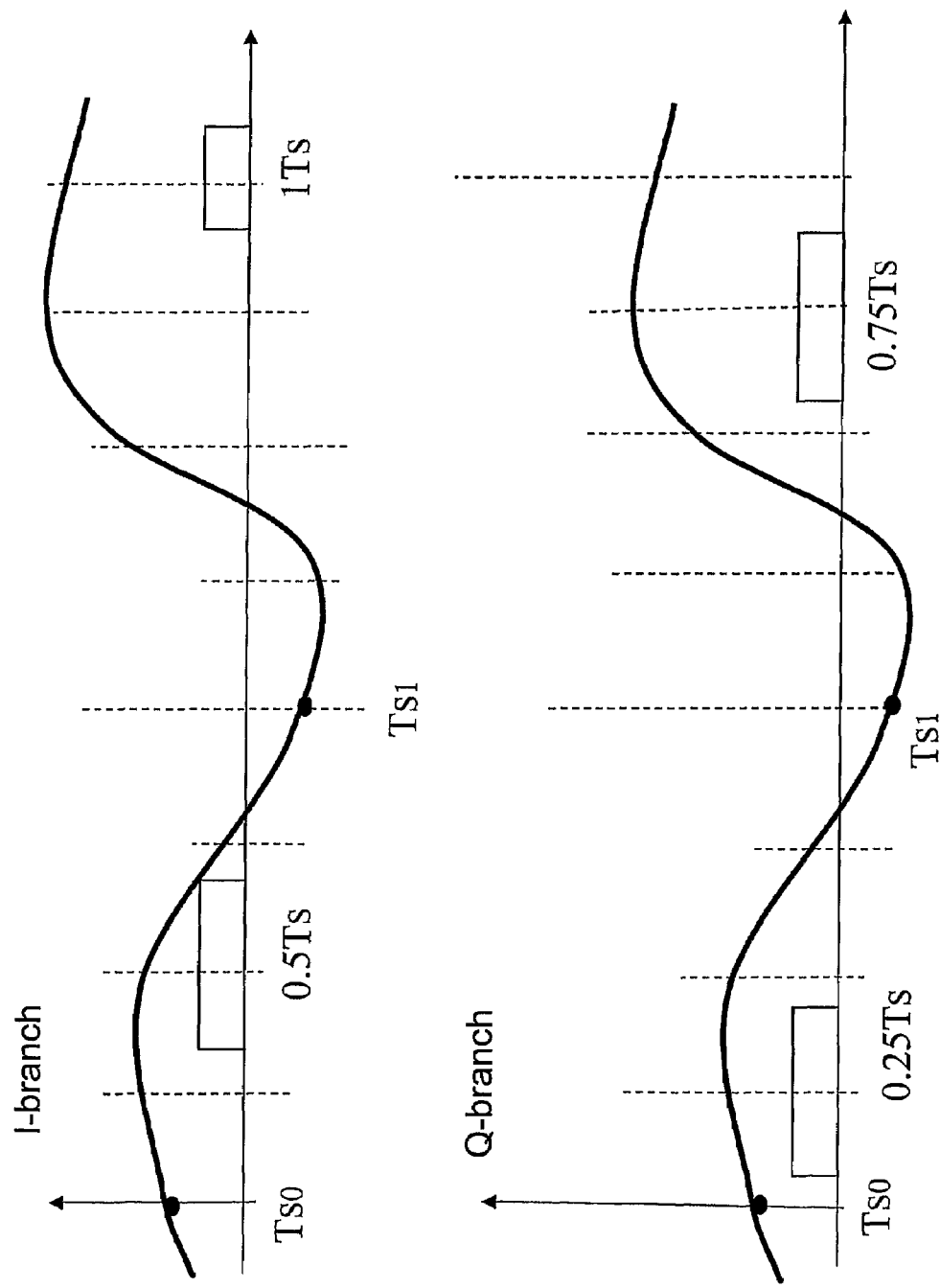
FIG. 8 illustrates mapping of positive or negative samples of the I-branch- and the Q-branch signals, according to an exemplary embodiment of this invention.

FIG. 8 illustrates the modulation according to an exemplary embodiment of the switch-modulator according to the second and third embodiment of this invention, involving separate pulse width modulation of the I-signal and the Q-signal, forming a unipolar modulated pulse sequence. The I-branch is delayed by 0.25 Ts relative the Q-branch, resulting in that a sample in the I-branch at Ts0 is placed on 0.5 Ts, while a sample in the Q-branch at Ts0 is placed on 0.25 Ts. Further, a pulse associated with the positive amplitude at Ts0 is placed in the first half of the sampling period, i.e. at 0.5 Ts and 0.25 Ts, in the I-branch and in the Q-branch, respectively, while a pulse associated with the negative amplitude at Ts1 is placed in the second half, i.e. at 1 Ts and at 0.75 Ts in the I-branch and Q-branch, respectively. By means of the illustrated concept, a complex signal is transformed into a real signal by assigning the pulses to slightly different positions within the sample interval Ts. Obviously, the described positions are only examples of suitable positions within the sample interval, and several alternative positions are possible, provided that the I-signal sample pulse is delayed with 0.25 Ts relative the Q-signal sample pulse, and that the negative sample pulses are displaced with 0.5 Ts relative the positive sample pulses. For a unipolar pulse sequence, i.e. having binary levels, the position of the pulses depends on the sign of the two input signals I and Q, according to the following exemplary Table 2:

| Signal value | Position within T |
| --- | --- |
| Positive Q | 0 T |
| Negative Q | 0.5 T |
| Positive I | 0.25 T |
| Negative I | 0.75 T |

Thus, according to the second and third embodiments of the switch-modulator according to this invention, the amplitude and phase information is coded by the width of each pulse in two separate time-shifted I- and Q-signal pulse sequences, and by the positioning of the pulses on fixed time-shifted positions within the sample period, T.

Figure 9:
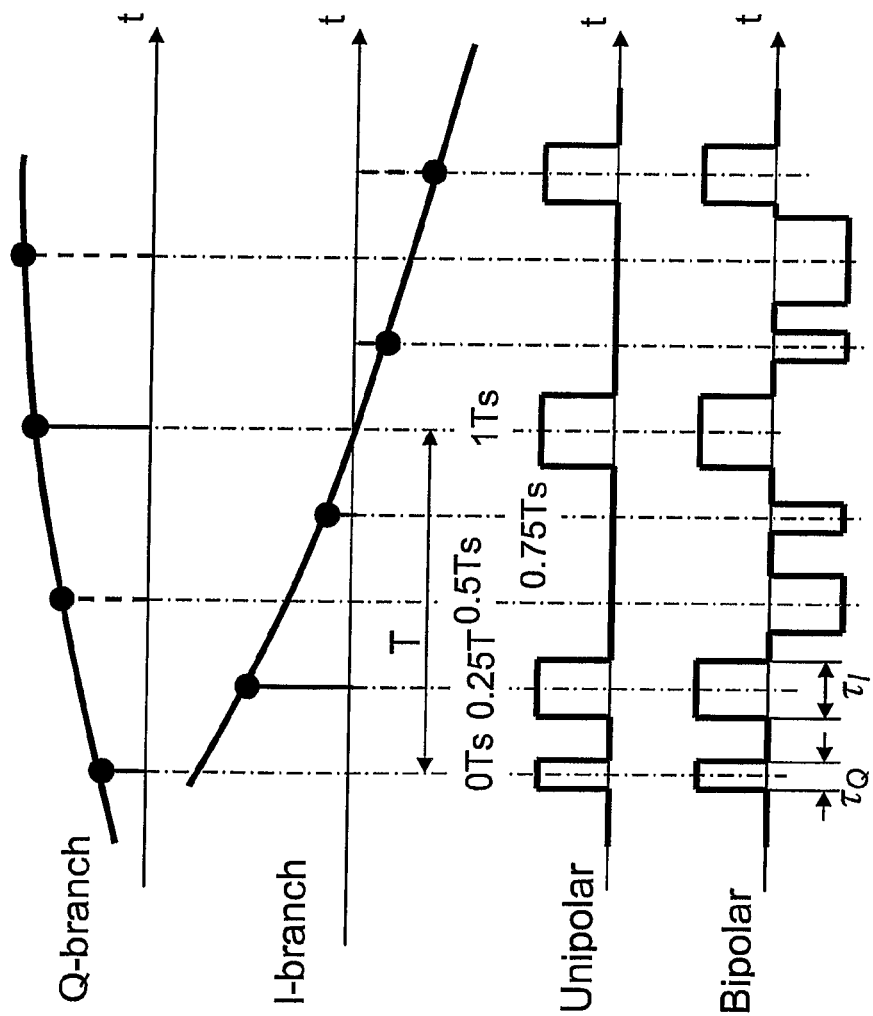
FIG. 9 illustrates Cartesian pulse width modulation for unipolar and bipolar pulses.

FIG. 9 illustrates Cartesian pulse width modulation of positive or negative samples of the I-branch- and the Q-branch signals onto a resulting unipolar and a bipolar pulse sequence, respectively.

A switch-modulator 15 according to this invention comprises an I-signal part 2a and a Q-signal part 2b, the I-signal part having a first input to the I-branch and the Q-signal part having a second input to the Q-branch. The switch-modulator 15 is also provided with a third input for a clock signal at the intended carrier frequency, or at the centre frequency of the pass-band of the radio frequency signal, if this is composed of several modulated carriers. In accordance with the first embodiment, the output of each of the I- and Q-branch consists of balanced outputs in the form of two separate 50% duty cycle binary square pulse sequences, properly time-shifted in relation to each other in order to encode the amplitude of I and Q branches respectively, also including the needed arcsine inverse pre-distortion. The I- and Q-branch outputs are also properly time-shifted in relation to each other in order to represent the quadrature position of the Q-signal (+90 degrees), enabling a simplified combination of the I- and Q-branch outputs, either within the switch-modulator and before the amplification, or after the amplification.

The outputs of the I- and Q-branch may, alternatively, in accordance with the second a third embodiments, consist of outputs in the form of a single (unbalanced) modulated binary square wave pulse sequence, requiring a less complicated radio architecture.

Figure 10:
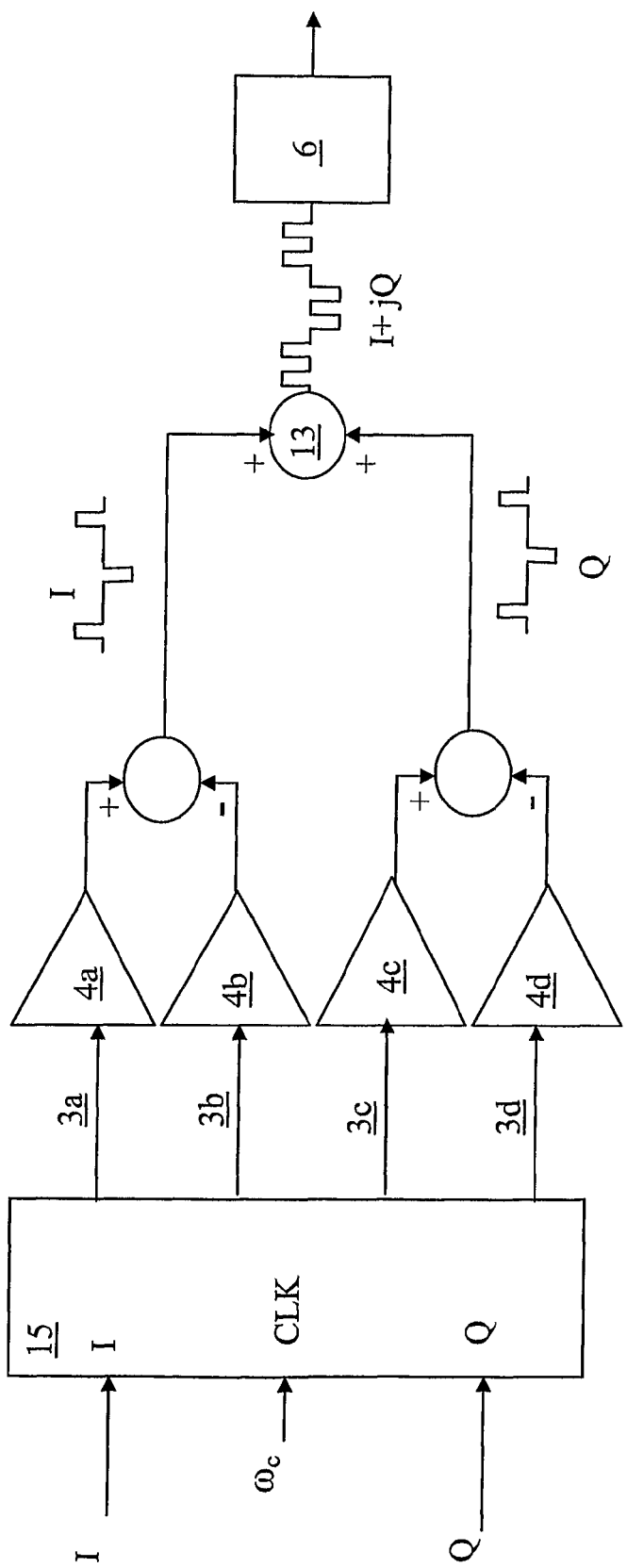
FIG. 10 shows a first exemplary switched-mode RF-amplifier arrangement comprising a switch-modulator according to this invention.

FIG. 10 illustrates an arrangement of a switched-mode radio-frequency power amplifier, comprising a switch-modulator 15 according to a first embodiment of this invention, having differentially time-shifted balanced outputs from the switch-modulator 15. The I-signal part of the switch-modulator 15 comprises a first input for the I-signal of a baseband signal, an I-signal path through the switch-modulator and two balanced I-signal outputs of a modulated unipolar square pulse sequence. The two balanced output pulse sequences have properly differentially time-shifted 50% duty cycle-pulses within each sampling period in order to encode the amplitude of the I-signal, including the required arcsine pre-distortion, and the two balanced output pulse sequences are amplified in power amplifiers 4a, 4b and combined in a differential combiner, creating a bipolar I-signal pulse sequence. Similarly, the Q-signal part of the switch-modulator 15 comprises a second input for the Q-signal of a baseband signal, a Q-signal path through the switch-modulator 15 and two balanced Q-signal outputs of a properly differentially time-shifted unipolar pulse sequence. Additionally, the I-signal output pulse sequences and the Q-signal output pulse sequences are properly time-shifted in relation to each other in order to represent the quadrature position of the Q-signal. The two balanced Q-outputs are amplified in power amplifiers 4c, 4d and combined in a differential combiner, creating a bipolar Q-signal pulse sequence. Thereafter, the amplified bipolar I-pulse sequence and the bipolar Q-pulse sequence are combined in combiner 13, creating the amplified I+jQ-signal, which is filtered in a suitable band-pass filter 6. The switch-modulator 15 further comprises a third input for the clock signal at the carrier frequency.

Figure 11:
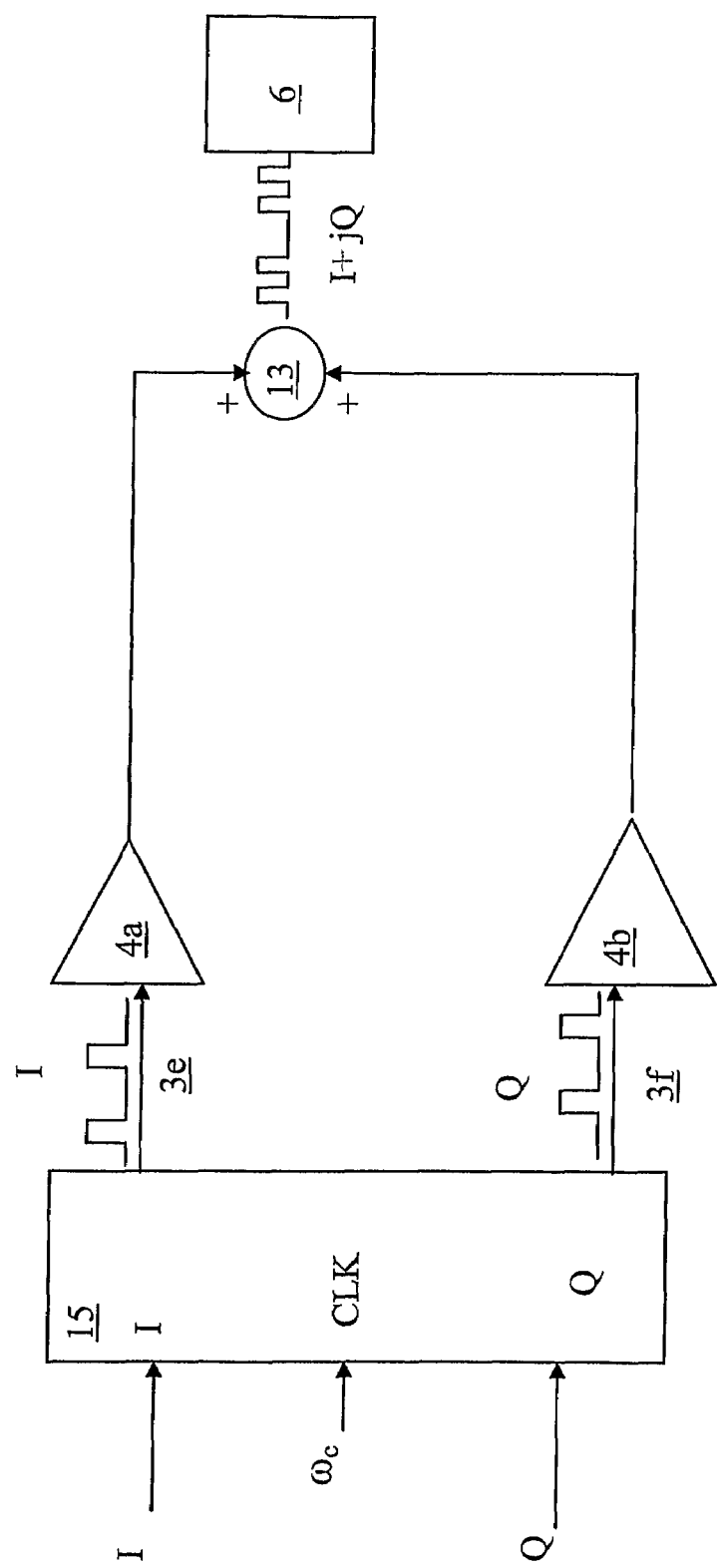
FIG. 11 shows a second exemplary switched-mode RF-amplifier arrangement comprising a switch-modulator according to this invention.

FIG. 11 illustrates an arrangement of a switched-mode radio-frequency power amplifier, comprising a switch-modulator 15 according to a second embodiment of this invention, having unbalanced outputs. The I-signal part of the switch-modulator 15 comprises a first input for the I-signal of a baseband signal, an I-signal path through the switch-modulator and one unbalanced I-signal output of a modulated unipolar square pulse sequence 3e. The I-signal output pulse sequences has properly pulse width modulated and time-shifted pulses within each sampling period, in order to encode the amplitude of the I-signal, including the required arcsine pre-distortion, and is amplified in the power amplifier 4a. Similarly, the Q-signal part of the switch-modulator 15 comprises a second input for the Q-signal of a baseband signal, a Q-signal path through the switch-modulator 15 and an unbalanced Q-signal output of a pulse width modulated and properly time-shifted unipolar pulse sequence 3f, which is amplified in the power amplifier 4b. Additionally, the I-signal output pulse sequence 3e and the Q-signal output pulse sequence 3f are properly time-shifted in relation to each other in order to represent the quadrature position of the Q-signal. Thereafter, the amplified I-pulse sequence and the Q-pulse sequence are combined in a suitable combiner 13, creating a combined unipolar amplified I+j-Q-signal, which is filtered in a suitable band-pass filter 6. The switch-modulator 15 further comprises a third input for the clock signal at the carrier frequency.

Figure 12:
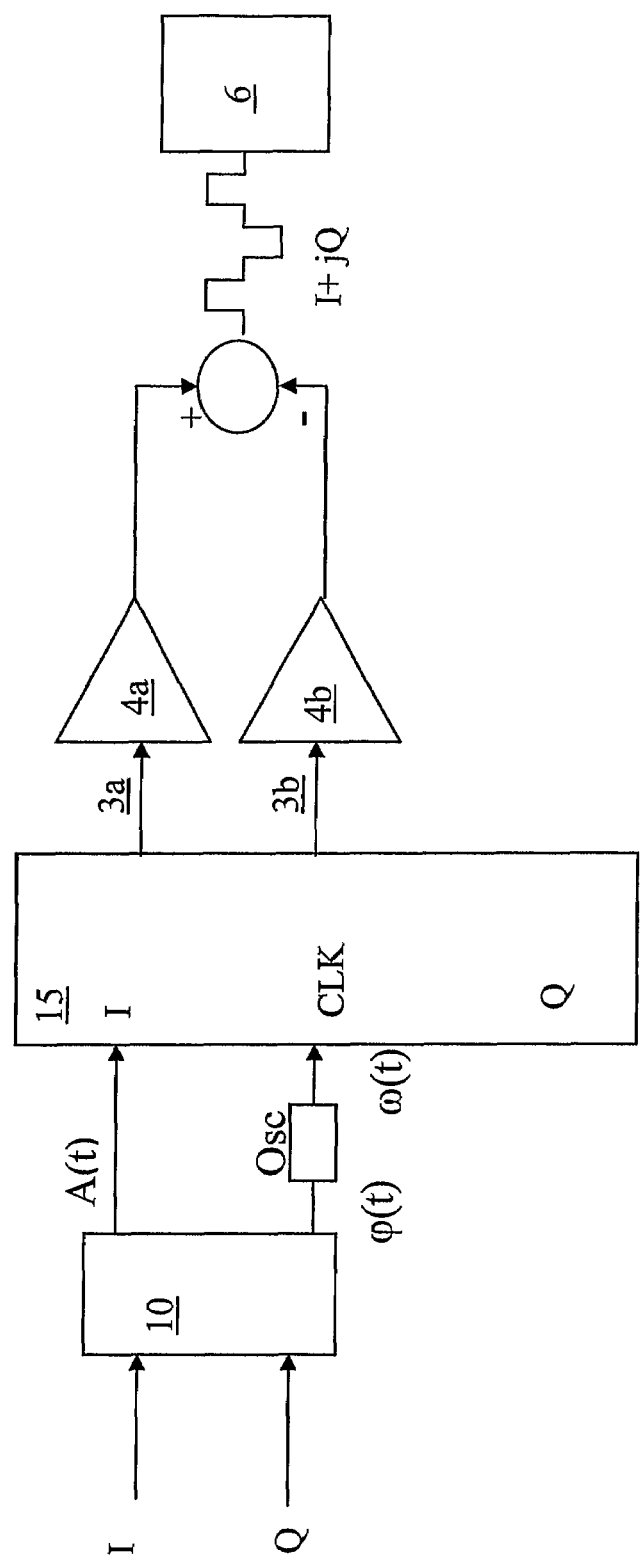
FIG. 12 shows a third exemplary switched-mode RF-amplifier arrangement comprising a switch-modulator according to this invention.
Figure 13:
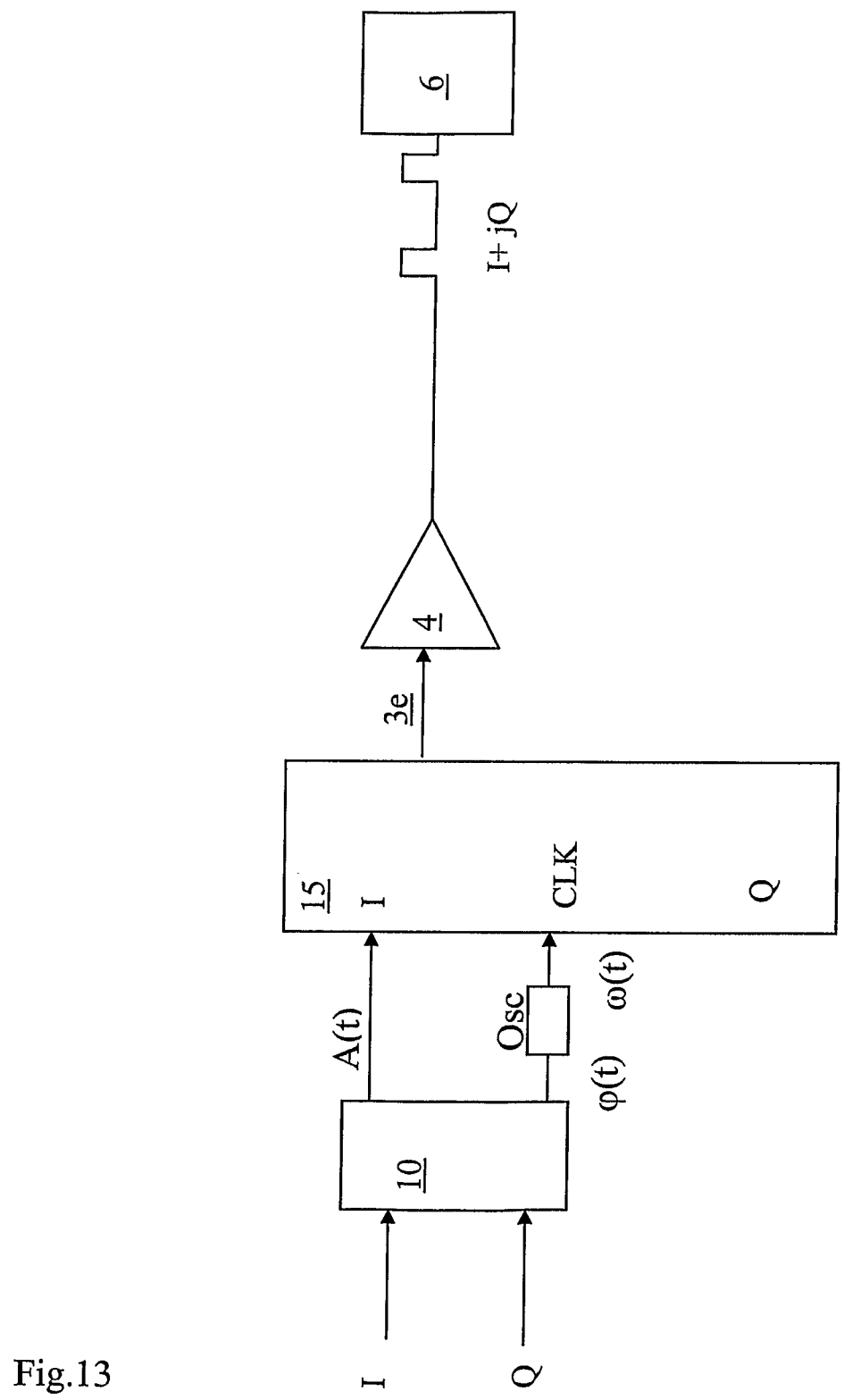
FIG. 13 shows a fourth exemplary switched-mode RF-amplifier arrangement comprising a switch-modulator according to this invention.

FIGS. 12 and 13 illustrates a switched-mode amplifier arrangement comprising a switch-modulator 15 according to this invention, showing how the switch-modulator 15 is capable of functioning as a combined pulse width/pulse position modulator, generating radio frequency signals from base band signals represented by polar coordinates, i.e. the amplitude and the phase. The Cartesian coordinates of a base band signal I+jQ, i.e. the I-signal and the Q-signal, are converted into Polar coordinates by the converter 10, and the amplitude-signal, A, and the phase-signal, φ, represents the Polar coordinates. The phase signal modulates a carrier frequency signal into the clock input of the modulator, and the amplitude signal feeds the I-signal input, or alternatively the Q-signal input, of the switch-modulator 15.

In FIG. 12, the illustrated arrangement comprises a switch-modulator 15 according to a first embodiment of this invention, having two balanced I-outputs and two balanced Q-outputs. Two unipolar, modulated balanced pulse sequences 3a, 3b, are output from switch-modulator 15 and amplified by two power amplifiers 4a, 4b. Thereafter, the modulated and amplified balanced pulse sequences are combined in a differential combiner into a bipolar pulse sequence, which is filtered in the band-pass filter 6.

In FIG. 13, the illustrated arrangement comprises a switch-modulator 15 according to a second embodiment of this invention, having an unbalanced I-output and an unbalanced Q-output. A unipolar pulse width- and pulse position-modulated pulse sequence is output from switch-modulator 15 and amplified the power amplifier 4. Thereafter, the modulated and amplified pulse sequence is filtered in the band-pass filter 6.

Figure 14:
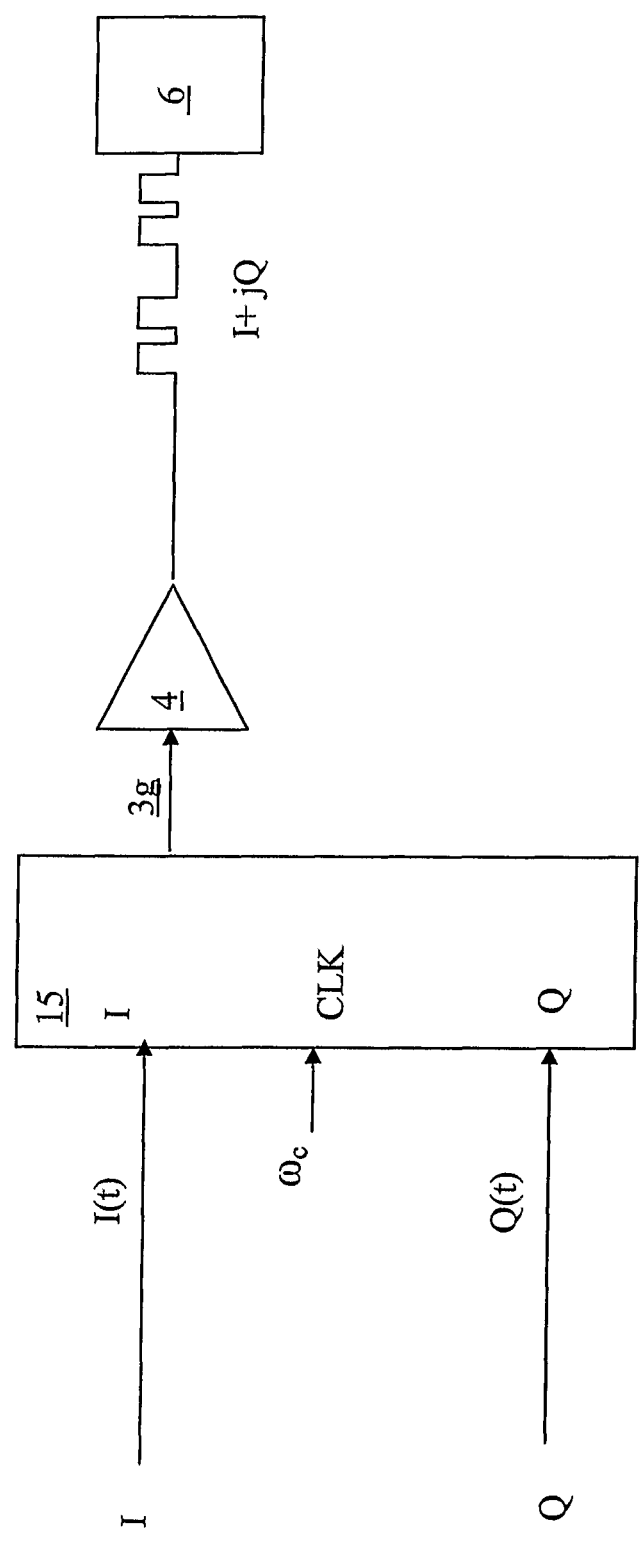
FIG. 14 shows a fifth exemplary switched-mode RF-amplifier arrangement comprising a switch-modulator according to this invention.

FIG. 14 illustrates an arrangement comprising a switch-modulator 15 according to a third embodiment, which performs the combination of the I-signal and Q-signal within the switch-modulator, before the amplification, by generating a combined, unbalanced binary level output signal to be forwarded directly to a single switched-mode amplifier 4. In this case, means for restricting the peak levels of the base band I- and Q-signals must be inserted before the input of the switch-modulator in order to avoid overlapping I- and Q-pulses, e.g. for performing suitable level back-off or a clipping function (not illustrated in the figure). In this third embodiment, the switch-modulator can not have balanced outputs, and it can not handle input signals representing polar coordinates of the base band signal.

In all of the above-described figures, the filter 6 is shown in a position after the combination of the I-signal and the Q-signal. However, this position of the filter is only illustrated to give more clear conceptual view of the invention. In a real implementation, a preferred position of the filter or filters may e.g. be closer to the switching devices in the power amplifiers, and before the combination of the I-signal and the Q-signal.

Figure 15:
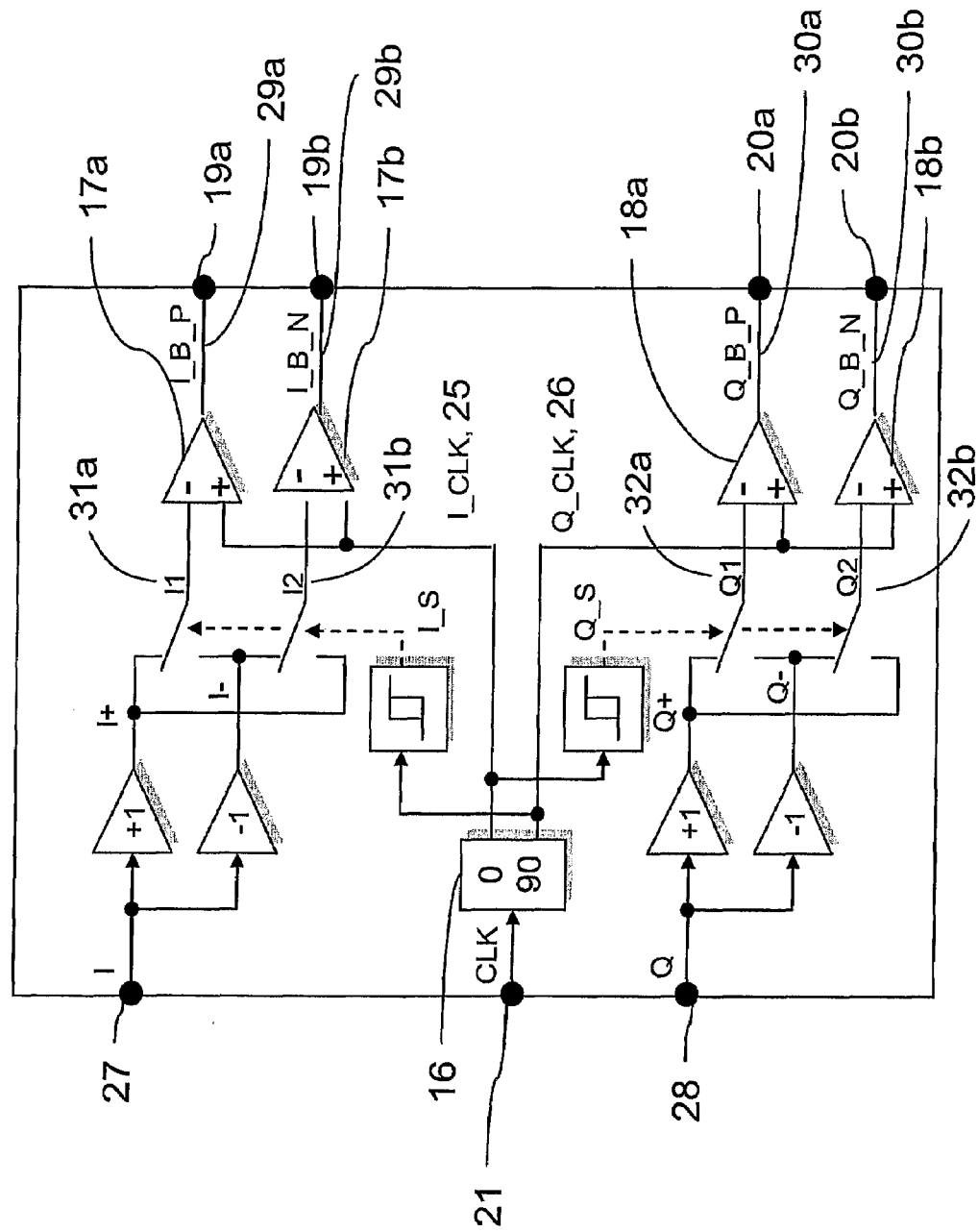
FIG. 15 is a block diagram of a switch-modulator according to a first embodiment of this invention.
Figure 17:
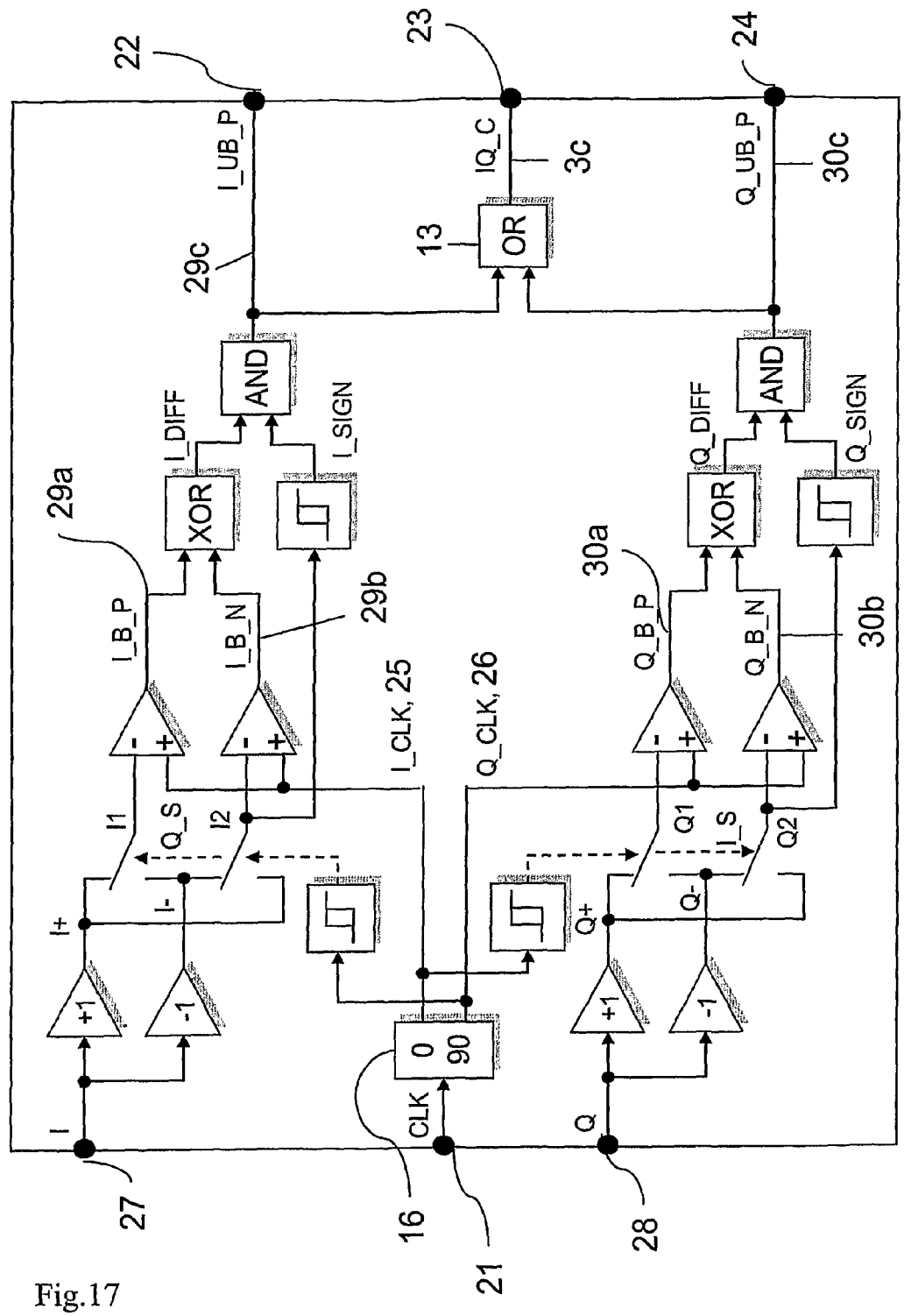
FIG. 17 is a block diagram of a switch-modulator according to a second and third embodiment of this invention.

An advantage with a switch-modulator 15 according to the above-described embodiments of this invention is that it can have a circuit design that may be implemented e.g. as an RF ASIC, and such circuit designs are illustrated in the FIGS. 15 and 17.

FIG. 15 shows a functional block diagram of an exemplary circuit design implementing a switch-modulator 15 according to a first embodiment, having balanced outputs, and the functional blocks can be implemented in different ways, depending on the circuit implementation technology. The circuit in FIG. 15 comprises an unbalanced I-input 27 and an unbalanced Q-input 28, and differential balanced signals are created by passing of the signals through unity gain inverting and non-inverting amplifiers, as illustrated in the figure, or by any other suitable means. In the Q-signal branch, one of the differential signals Q+ and Q– is selected alternately and in opposite ways, e.g. by means of two switches. The switches are steered from the level of a 50% duty cycle square wave clock signal Q_S, thereby generating the two chopped signals Q1, 32a, and Q2, 32b, having opposite phases. The two square wave clocks Q_S and I_S can e.g. be generated by a Schmitt trigger function from the sinusoidal, opposite branch, I-clock signal 25, I_CLK, and Q-clock signal 26, Q_CLK, respectively, generated by the quadrature clock generator 16 incorporated in the circuit. The reference input for the quadrature clock generator 16 is the input clock signal 21, CLK, of the circuit. The signals Q1, 32a, and Q2, 32b and the quadrature-phase sinusoidal Q-clock signal Q_CLK 26 are connected to two comparators 18a, 18b, where the Q-clock signal is connected to the positive inputs in parallel and the chopped Q-branch signals Q1, 32a, and Q2, 32b are connected to the negative inputs, respectively. The outputs 20a, 20b, from the comparators 18a, 18b constitute the two differentially time-shifted balanced binary-level Q-output drive signals Q_B_P, 30a and Q_B_N, 30b, for a switched-mode RF power amplifier.

Figure 16:
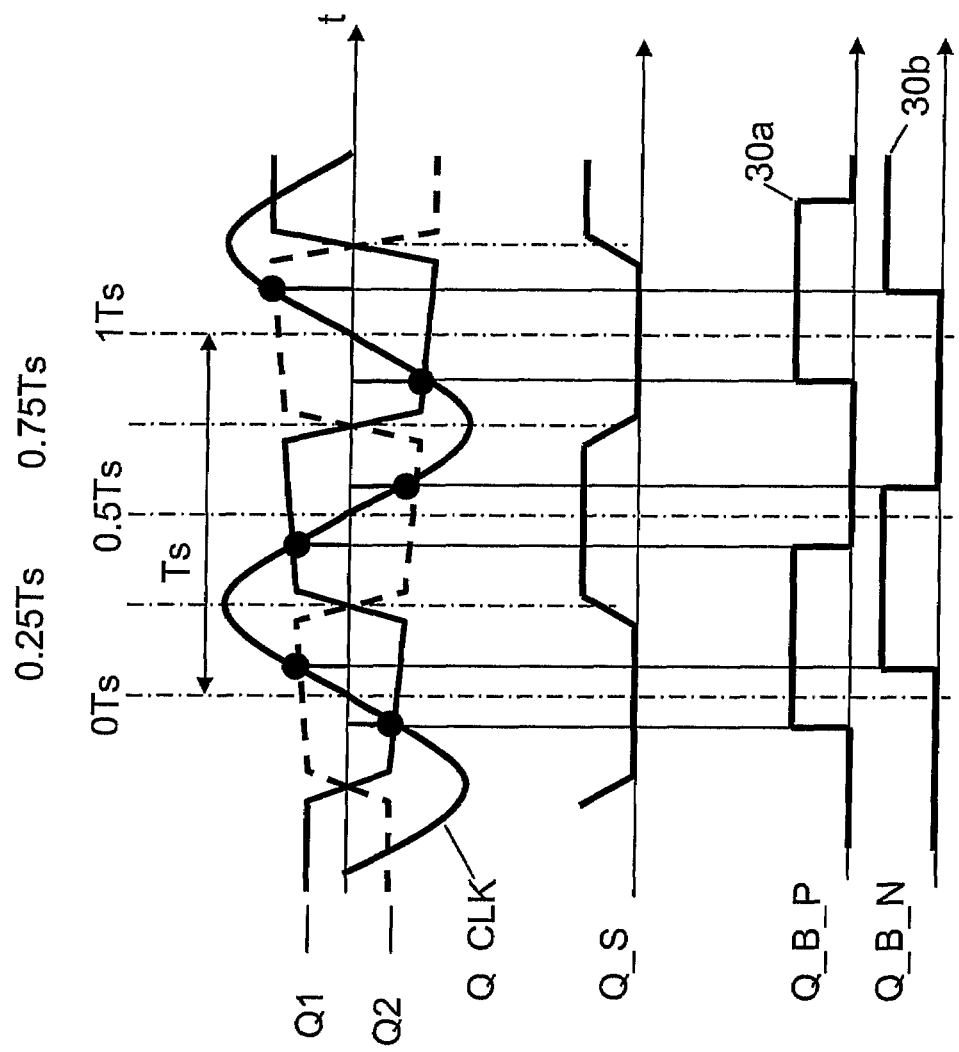
FIG. 16 illustrates pulse sequences according to FIG. 15.

FIG. 16 illustrates some of the above-described signals generated in the Q-branch, relative 0 Ts, 0.25 Ts, 0.5 Ts, 0.75 Ts and 1 Ts.

The I-branch in the circuit according to FIG. 15 functions in the same way as the above-described Q-branch, only properly time-shifted by the in-phase sinusoidal I-clock signal 25, I_CLK, and the square wave clock I_S. Accordingly, the outputs 19a, 19b, from the comparators 17a, 17b constitute the two differentially time-shifted balanced binary-level I-output drive Signals I_B_P and I_B_N 29a, 29b, for a switched-mode RF power amplifier.

Note that the clock signals I_S and Q_S used for steering the switches are in quadrature to the actual signal-branch I-clock signal 25, I_CLK, and Q-clock signal 26, Q_CLK, respectively.

Thus, the I-signal and the Q-signal are processed in separate paths in the switch-modulator, maintaining the proper phase difference as a time-shift in the output signals by means of the common synchronizing quadrature clock signals. Further, the circuit will generate a correct arcsine pre-distorted differential time-shift around the fixed offsets, according to the above-indicated tables, of the two output pulse sequences, maintaining an approximate 50% duty cycle. This results in low sensitivity to signal- and clock level-errors. Furthermore, by means of this circuit design, exact sampling positions corresponding to the resulting pulse positions are achieved, thereby resulting in a very low distortion level of the resulting RF signal. Additionally, any resulting level imbalance in the pulse width, or phase imbalance in the time-shift between the I- and Q-branches will not lead to any degradation of the IM (Inter-Modulation) performance, only to a degradation of the EVM (Error Vector Magnitude) performance, due to the final linear superposition of the two branches.

FIG. 17 shows a functional block diagram of another exemplary circuit design provided with additional circuitry implementing a switch-modulator 15 according to the second embodiment, having an unbalanced I-output 22 and an unbalanced Q-output 24, as well as according to the third embodiment, having an unbalanced combined I+jQ-output 23. This circuit is implemented by generating unbalanced output signals 29c, 30c for the I- and Q-branches by a logic combination of the differentially time-shifted balanced I- and Q signals 29a, 29b, 30a, and 30b, which constituted outputs in the circuit illustrated in FIG. 13 implementing a switch modulator according to a first embodiment.

In FIG. 17, the XOR-gate receiving the balanced I- and Q-signals 29a,b and 30a,b, implements a difference function (I_DIFF or Q_DIFF) between said balanced signals 29a,b (I_B_P and I_B_N) and between the balanced signals 30a,b (Q_B_P and Q_B_N), generating a unipolar pulse sequence having two pulses in each sample period. The Schmitt trigger function (I_SIGN or Q_SIGN) from the chopped signal (I2 or Q1) together with the AND-gate selects one of these pulses, at the correct position, depending of the sign of the input I or Q signals.

Additionally, according to the third embodiment, a logic combination of the unbalanced I- and Q signals 29c and 30c generates a single unbalanced combined output signal 3c comprising the combination, i.e. addition, of the I- and Q-branches, forming I+j·Q, which also requires a restriction of the pulse widths in order to avoid overlapping I and Q pulses. The OR-gate 13 combines the unipolar pulse sequences in the I- and Q-branch into one combined pulse sequence 3c (IQ_C) on the output 23.

Figure 18:
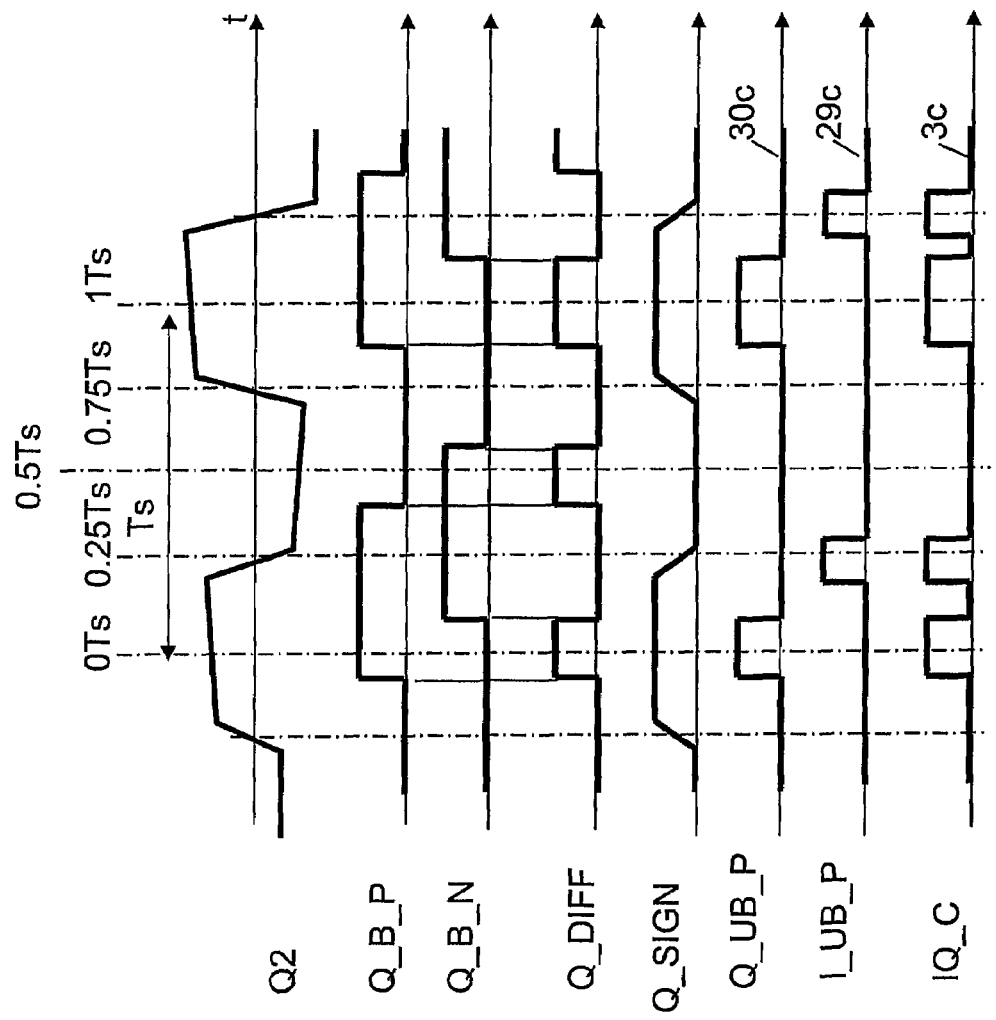
FIG. 18 illustrates pulse sequences according to FIG. 17.

FIG. 18 illustrates some of the above-described signals generated in the Q-branch, as well as the output signals, relative 0 Ts, 0.25 Ts, 0.5 Ts, 0.75 Ts and 1 Ts.

Figure 19:
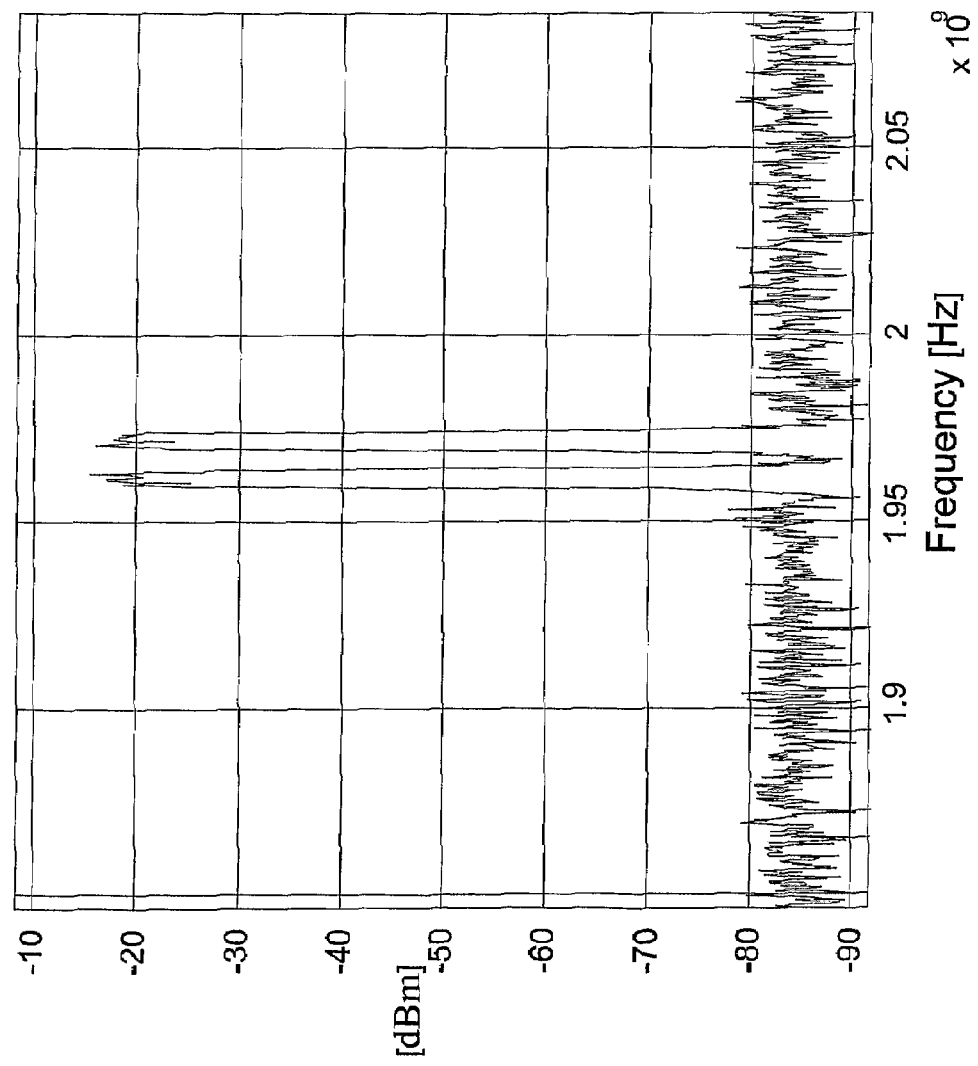
FIG. 19 illustrates a band-pass filtered amplified radio frequency signal achieved by a switched-mode amplifier arrangement comprising a switch-modulator according to this invention.

FIG. 19 illustrates a magnified view of a filtered-out spectrum of a base band signal that is switched-modulated and amplified, according to the method and arrangement of this invention. The filtered-out frequencies represent the amplified original complex base band signal, and the two-carrier nature of the filtered-out signal indicates that a good dynamic range is achieved.

Figure 20:
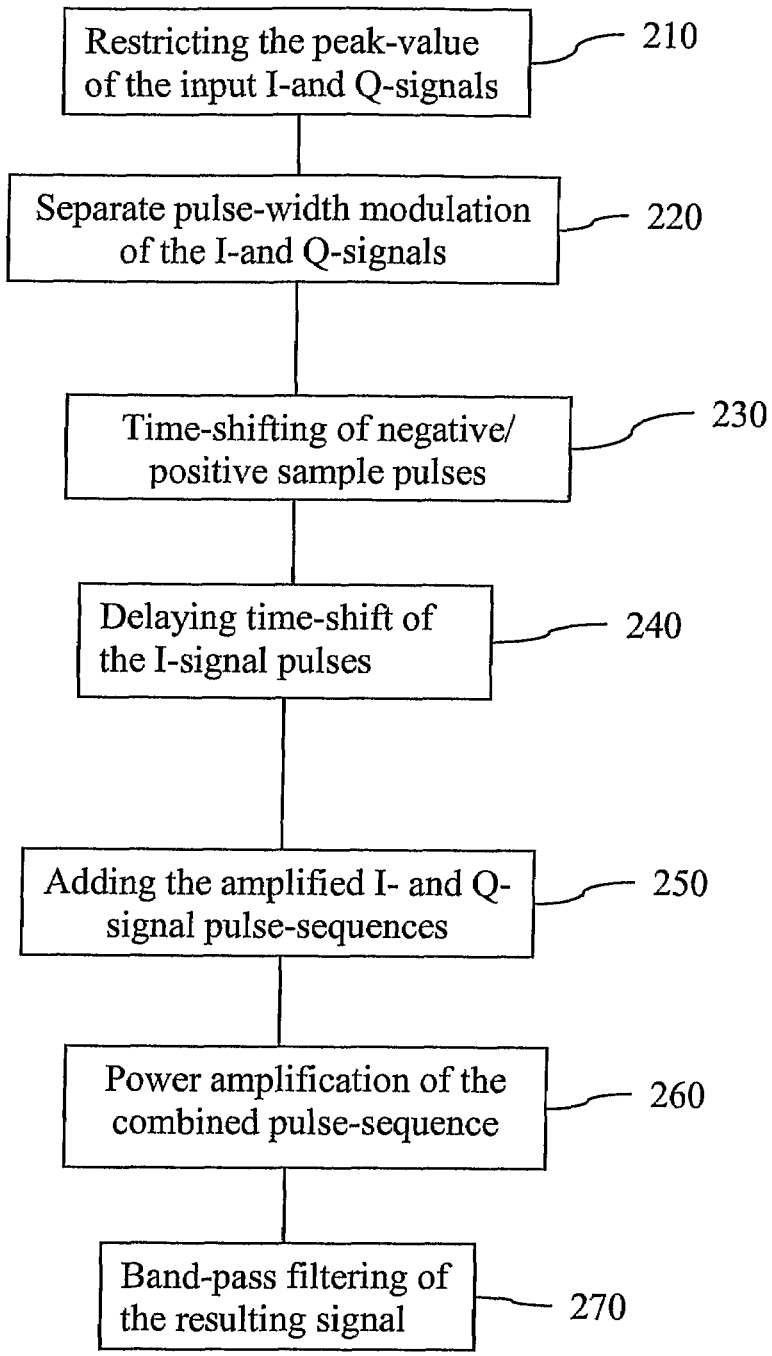
FIG. 20 is a flow chart of the method of switch-modulating a RF-power amplifier, according to the third example of a switch-modulated amplifier arrangement.

FIG. 20 is a flow chart illustrating a method of switch-modulating an input signal to a radio frequency power amplifier, according to an exemplary arrangement of this invention, as illustrated in the FIGS. 7 and 14, in which the combination of the I- and Q-branch is performed before the amplification.

In the method in FIG. 20, the sampled input base band signal in the Cartesian complex coordinates I+j·Q is represented by one I-signal branch and one Q-signal branch, of which the peak-levels are restricted, in step 210, in order to avoid overlapping pulses. Thereafter, in step 220, the I- and Q-signals are input to two separate pulse width modulators for mapping of the amplitude of each sample on the width of a pulse in a pulse sequence.

A time shift of the pulses representing negative amplitudes relative the pulses representing positive amplitudes is performed in step 230, placing the positive and negative sample pulses on two different positions within the sample period, e.g. positive sample pulses on 0.25 Ts and negative sample pulses on 0.75 Ts. In order to facilitate a simple combining of the separate I-signal and Q-signal branches again to re-create the complex representation I+j·Q, the pulse sequence representing the I-signal branch is delayed in step 240, e.g. by 0.25 Ts, which corresponds to a multiplication with j.

In step 250, the amplified pulse sequences are combined to create a complex representation I+j·Q, and in step 260, the combined pulse sequence is amplified in a power amplifier. Finally, in step 270, the combined and amplified pulse sequence is filtered in a suitable band pass filter, to obtain an amplified base band signal.

This invention is suitable for use in a Voltage Mode Class D (VMCD) switched-mode power amplifier-topology, but it is not limited to be used in such a topology. Specifically, three variants of VMCD topology may use a switch-modulator according to this invention. The first variant is the double balanced topology, having two H-bridges, one for each of I and Q and using balanced drive signals, according to the first embodiment of the invention. The second variant is the balanced topology, having an H-bridge with one half-bridge for each of I and Q and using unbalanced drive signals, according to the second embodiment of the invention. The third variant is the single-ended topology, also called Class F, using a combined I- and Q-drive signal, according to the third embodiment of the invention. However, this invention is not limited to any of these topologies.

The presented switch-modulator according to this invention is suitable for switched-mode radio frequency power amplifiers, achieving a large power efficiency and dynamic range and avoiding phase wrap-around and phase jumps. Further, the switch modulator can be implemented with a circuit design suitable for RF ASIC.

Regarding the linearity, the switch-modulator performs sampling of the I- and Q-signals at the correct positions in relation to the actual time-shifted positions of the output pulses, without requiring any interpolation. Further, it performs the required arcsine pre-distortion of amplitude signals with low sensitivity to amplitude errors, and avoids the time granularity problem of the digitally defined pulse width and position. A switch-modulator according to one embodiment of this invention is capable of generating differential (balanced) binary level outputs that can be easily combined after the amplification in switched-mode power amplifiers (PA:s), and thereby the combined signal is insensitive to the linear or non-linear response of the amplifiers, only to differences in the responses between the two amplifiers. Further, the intermodulation performance is un-sensitive to any imbalance between the internal I and Q signals and between the quadrature clocks, and to the relative phase shifts of these signals, meaning that low values of spurious or Inter-Modulation (IM) components (<−65 dBc in simulations) will be generated in the output RF spectrum, from zero frequency up to 3 times the carrier frequency for balanced output signals, and ideally not further linearization of the PA is needed.

Regarding the efficiency, the switch modulator according to this invention will not inherently restrict the achievable power efficiency.

Regarding the sensitivity, the Error Vector Magnitude (EVM) will be affected by any imbalance between the internal I- and Q-signals, between the quadrature clocks and the phase shifts of these signals, and by any imbalance in the gain between the two separate power amplification branches for I and Q. However, the sensitivity is low for phase shifts.

Regarding the radio architecture, the inputs to a switch-modulator according to this invention can be connected directly to the output from a Digital-to-Analogue converter with a relatively low sampling rate, after low pass filtering. Further, the embodiment having unbalanced outputs allows less complicated radio architecture.

While the invention has been described with reference to specific exemplary embodiments, the description is in general only intended to illustrate the inventive concept and should not be taken as limiting the scope of the invention.

The invention claimed is:

1. A switch-modulator for a switched-mode radio-frequency power amplifier, the switch-modulator arranged to map a phase and amplitude of an input complex baseband signal, represented by an I-signal and a Q-signal, onto modulated output pulse sequences, and sample and modulate the I-signal and the Q-signal separately, a modulation comprising a time-shift of pulse positions within a sampling interval, the switch-modulator comprising:
   a first input to a separate I-signal path in the switch-modulator;
   a second input to a separate Q-signal path in the switch-modulator; and
   a third input to a quadrature clock generator in the switch-modulator, the quadrature clock generator being arranged to generate an I-clock signal and a Q-clock signal having a quadrature-shifted phase-relationship in order to delay the modulated I-signal pulse sequence relative to the modulated Q-signal pulse sequence, and to generate a time-shift of the pulse positions in the modulated output pulse sequences.

2. The switch-modulator according to claim 1, wherein the I-clock signal and Q-clock signal are sinusoidal, and arranged to generate an arcsine pre-distortion associated with the modulated output pulse sequences.

3. The switch-modulator according to claim 1, wherein the modulation of the I-signal and the Q-signal comprises mapping of the amplitude of the I-signal and the Q-signal on a differential time position of two balanced 50%-duty cycle modulated I-signal pulse sequences and two balanced 50%-duty cycle modulated Q-signal pulse sequences, respectively.

4. The switch-modulator according to claim 1, wherein the modulation of the I-signal and the Q-signal comprises mapping of the amplitude on pulse widths for pulses of the I-signal and the Q-signal, and time-shifting the pulses corresponding to negative sample values relative to the pulses corresponding to positive sample values onto an unbalanced modulated I-signal pulse sequence and an unbalanced modulated Q-signal pulse sequence, respectively.

5. The switch-modulator according to claim 4, wherein the I-clock signal and the Q-clock signal are arranged to generate correct time-shifted positions and pulse widths for the unbalanced modulated I-signal pulse sequence and the unbalanced modulated Q-signal pulse sequence.

6. The switch-modulator according to claim 4, wherein a combiner is arranged to generate a combined modulated pulse sequence, representing a complex I+J*Q-signal, from the unbalanced modulated I-signal pulse sequence and the unbalanced modulated Q-signal pulse sequence.

7. The switch-modulator according to claim 4, wherein a time-shift of the pulses corresponding to the negative sample values relative to the positive sample values corresponds to 0.5 of the sampling interval.

8. The switch-modulator according to claim 1, wherein the delay of the modulated I-signal pulse sequence relative the modulated Q-signal pulse sequence is 0.25 of the sampling interval, which corresponds to a 90-degree phase-shift and simplifies a combination into a complex I+J*Q-signal.

9. The switch-modulator according to claim 1, further comprising two I-signal comparators for generating two differentially time-shifted balanced modulated I-signal pulse sequences from the I-clock signal and from two opposite-phase and chopped I-signals, and two Q-signal comparators for generating two differentially time-shifted balanced modulated Q-signal pulse sequences from the Q-clock signal and from two opposite phase chopped Q-signals.

10. The switch-modulator according to claim 9, further comprising two I-signal outputs for the two differentially time-shifted balanced modulated I-signal pulse sequences and two Q-signal outputs for the two differentially time-shifted balanced modulated Q-signal pulse sequences.

11. The switch-modulator according to claim 9, further comprising an I-signal-gate for generating an unbalanced modulated I-signal pulse sequence from the two differentially time-shifted balanced modulated I-signal pulse sequences, and a Q-signal-gate for generating an unbalanced modulated Q-signal pulse sequence from two differentially time-shifted balanced modulated Q-signal pulse sequences.

12. The switch-modulator according to claim 11, comprising an I-signal output for the unbalanced modulated I-signal pulse sequence and a Q-signal output for the unbalanced modulated Q-signal pulse sequence.

13. The switch-modulator according to claim 1, further comprising a Cartesian-to-polar-converter for converting the I-signal and the Q-signal representing an input baseband signal into an A(t)-signal representing an amplitude of the input baseband signal and connected to the first input, and a phase modulated $\omega(t)$-signal representing a phase of the input baseband signal and connected to the third input.

14. The switch-modulator according to claim 11, wherein a combiner is arranged to add the unbalanced modulated I-signal pulse sequence to the unbalanced modulated Q-signal pulse sequence resulting in a combined modulated pulse sequence representing a modulated input baseband signal I+J*Q.

15. A method of switch-modulating a radio-frequency power amplifier, an input signal represented by an I-signal and a Q-signal of complex components (I+J*Q), the method comprising:
- sampling and pulse width modulating the I-signal and the Q-signal separately to create a modulated I-signal pulse sequence and a modulated Q-signal pulse sequence in a switch-modulator;
- time shifting pulses corresponding to negative sample values relative pulses corresponding to positive sample values of the I-signal and the Q-signal;
- delaying each pulse of the I-signal by introducing a delaying time shift; and
- combining the modulated I-signal pulse sequence and the modulated Q-signal pulse sequence after amplification to create a combined amplified pulse sequence.

* * * * *